US008717766B2

United States Patent
Arimai et al.

(10) Patent No.: US 8,717,766 B2
(45) Date of Patent: May 6, 2014

(54) RESIN-SEALED ELECTRONIC CONTROLLER AND METHOD OF FABRICATING THE SAME

(75) Inventors: Fumiaki Arimai, Chiyoda-ku (JP); Hiroyoshi Nishizaki, Chiyoda-ku (JP); Shozo Kanzaki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 44 days.

(21) Appl. No.: 13/326,531

(22) Filed: Dec. 15, 2011

(65) Prior Publication Data

US 2012/0300404 A1   Nov. 29, 2012

(30) Foreign Application Priority Data

May 26, 2011   (JP) ................................. 2011-117779

(51) Int. Cl.
*H05K 7/20*   (2006.01)
(52) U.S. Cl.
USPC ............ 361/720; 361/719; 257/706; 257/707
(58) Field of Classification Search
None
See application file for complete search history.

(56) References Cited

U.S. PATENT DOCUMENTS

| | | | |
|---|---|---|---|
| 6,429,513 B1 * | 8/2002 | Shermer et al. ............... | 257/714 |
| 6,770,970 B2 * | 8/2004 | Kobayashi .................... | 257/728 |
| 6,943,457 B2 * | 9/2005 | Smith ............................ | 257/790 |
| 7,439,452 B2 * | 10/2008 | Masuda ......................... | 174/536 |
| 7,453,138 B2 | 11/2008 | Kawakami et al. | |
| 7,514,784 B2 * | 4/2009 | Mayuzumi et al. ........... | 257/712 |
| 7,846,779 B2 * | 12/2010 | Yang ............................. | 438/123 |
| 7,868,430 B2 * | 1/2011 | Paulus et al. ................. | 257/668 |
| 7,888,852 B1 * | 2/2011 | Sung .............................. | 313/46 |
| 7,906,859 B2 * | 3/2011 | Yoshioka et al. ............. | 257/788 |
| 8,169,782 B2 * | 5/2012 | Takahashi et al. ............ | 361/721 |
| 8,207,607 B2 * | 6/2012 | Yamagishi et al. ........... | 257/724 |
| 8,472,197 B2 * | 6/2013 | Higashibata et al. ......... | 361/722 |
| 2008/0123299 A1 * | 5/2008 | Takakusaki et al. .......... | 361/719 |

FOREIGN PATENT DOCUMENTS

| | | |
|---|---|---|
| JP | 05-73957 U | 10/1993 |
| JP | 06-163811 A | 6/1994 |
| JP | 07-74195 A | 3/1995 |
| JP | 11-150216 A | 6/1999 |
| JP | 2003-37241 A | 2/2003 |
| JP | 2004-119465 A | 4/2004 |
| JP | 4283514 A | 6/2009 |
| JP | 2011-3680 A | 1/2011 |

OTHER PUBLICATIONS

Preliminary Notice of Reasons for Rejection dated Aug. 20, 2013, issued in Japanese Patent Application No. 2011-117779.

* cited by examiner

*Primary Examiner* — Boris Chervinsky
(74) *Attorney, Agent, or Firm* — Sughrue Mion, PLLC

(57) ABSTRACT

A resin-sealed electronic controller obtained by bonding and fixing a circuit board to a thermally-conductive base plate, and integrating circuit components with a molding resin so as to reduce the size. A base plate includes a first exposed portion, a second exposed portion, and an adjacent flat portion adjacent to a central window hole. First circuit components which are low-heat-generating components with large height are located in the central window hole. Second circuit components which are high-heat-generating components with small height are provided on an area corresponding to the adjacent flat portion. A height dimension of the first circuit components at least partially overlaps a thickness dimension of the base plate, to reduce a total thickness dimension. The high-heat-generating components and the low-heat-generating components being provided separately from each other permits increased mounting density of low-heat-generating components, reducing an area of the circuit board.

12 Claims, 15 Drawing Sheets

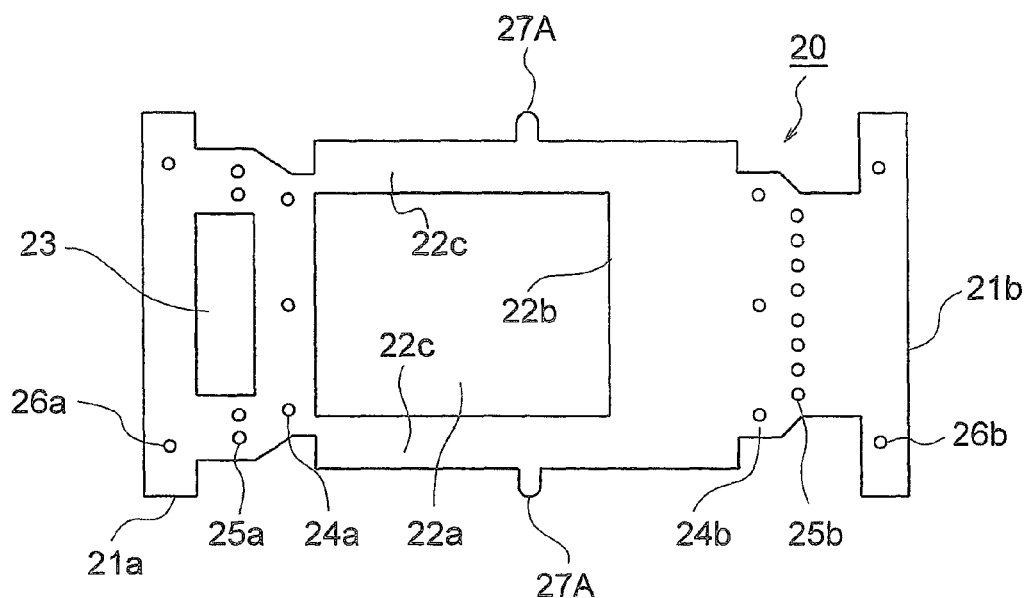
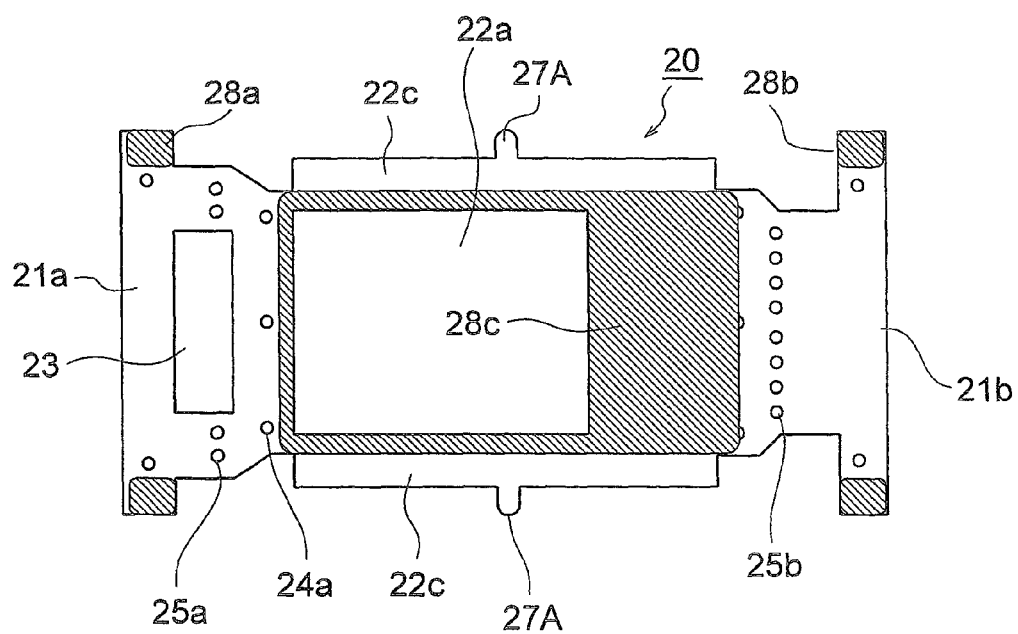

A-A SECTIONAL VIEW

B-B SECTIONAL VIEW

C-C SECTIONAL VIEW

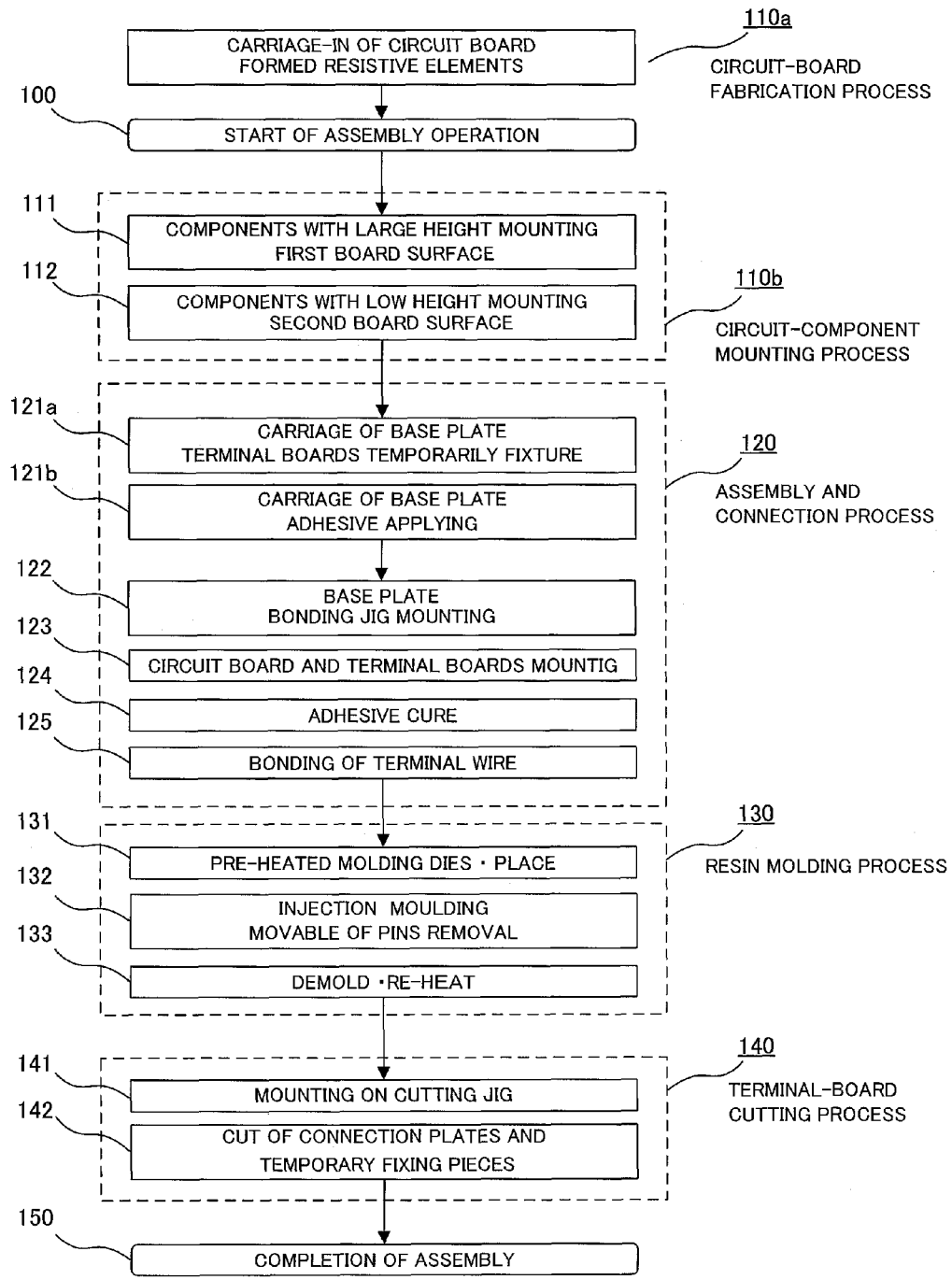

RESIN-SEALED ELECTRONIC CONTROLLER AND METHOD OF FABRICATING THE SAME

BACKGROUND OF THE INVENTION

1. Field of the Invention

The present invention relates to a resin-sealed electronic controller suitable as, for example, an on-vehicle electronic controller and a method of fabricating the same.

2. Description of the Related Art

In a control device for an automobile transmission, an integrated mechatronic product including an electronic controller provided inside the transmission is widely put into practical use. In the on-vehicle electronic controller, a circuit board formed by using a ceramic board is bonded to a thermally-conductive base plate serving as a heat diffuser plate. The entire body excluding a part of external connection terminals and the base plate is integrally molded with a thermally-curable resin.

For example, in an "electronic circuit device" described in Japanese Patent No. 4283514 (claim 1, paragraph [0268]) includes an electronic circuit assembly, a base plate, and lead terminals. The electronic circuit assembly includes electronic circuit elements including a semiconductor chip, and a circuit board on which the electronic circuit elements are mounted and a circuit pattern is formed. Onto the base plate, the electronic circuit assembly is bonded, and a flange portion is provided outside of an area in which the electronic circuit assembly is mounted. The lead terminals are electrically connected to the electronic circuit assembly and are made of a material having a larger linear expansion coefficient than that of the base plate.

The electronic circuit assembly, the base plate, and the lead terminals are molded at a time with a molding resin having a linear expansion coefficient substantially equal to that of the base plate except for a part of the flange portion and the lead terminals. The circuit board is a ceramic board. The base plate has a structure in which copper layers are formed on both surfaces of invar. The lead terminals are made of copper or a copper alloy material. A thickness center line of the molding resin in a vertical direction is approximately identical with a thickness center line of the circuit board.

According to the electronic circuit device described above, an inexpensive electronic circuit device for automobile without boundary separation between the molding resin, and the circuit board, the base plate and a lead frame or a resin crack due to a thermal stress can be realized.

However, the above-mentioned electronic circuit device has the following configuration. Specifically, the electronic circuit elements and the lead terminals are mounted on one surface of the circuit board, whereas the base plate is bonded to the other surface of the circuit board. Then, the electronic circuit elements, the lead terminals, the circuit board, and the base plate are integrally molded with the molding resin. At the same time, the thickness center line of the molding material after the molding is made substantially identical with the thickness center line of the circuit board.

Therefore, if electronic circuit components include a component having a large height, there are problems in that the circuit board cannot be bonded and an unnecessary molding resin undesirably adheres to a non-bonded surface of the base plate to be an excess thickness.

Moreover, one entire surface of the circuit board is bonded to the base plate. Therefore, the circuit board is a one-sided board having the other surface on which the electronic circuit elements and the lead terminals are mounted in a concentrated manner. Thus, there is a further problem that an increased area of a wiring board is required to ensure a mounting area for the circuit components.

Further, there is a further problem in that separation from molded outer covering material portions, which occurs with repeated changes in temperature due to a difference in linear expansion coefficient, is likely to occur if the wiring board has a large area.

SUMMARY OF THE INVENTION

The present invention has an object to provide a resin-sealed electronic controller capable of preventing a thickness dimension of a product as a whole from being increased even if electronic circuit components include a component having a large height, preventing the generation of an excess thickness of a molding material, and increasing a mounting density of a circuit board to reduce a projected area of the product as a whole, and provide a method of fabricating the resin-sealed electronic controller.

To this end, according to the preset invention, there is provided a resin-sealed electronic controller, comprising: a circuit board on which a plurality of circuit components are mounted; a thermally-conductive base plate bonded to the circuit board; a plurality of external connection terminals connected to the circuit board; and a molding resin for covering the entire circuit board and a part of the external connection terminals and the base plate to form outer covering material portions, the resin-sealed electronic controller being formed by integral molding with the molding resin, wherein: the base plate includes a central window hole formed in a middle portion, a first exposed portion and a second exposed portion exposed to exterior and fixed to mounting portions, and an adjacent flat portion adjacent to the central window hole formed in the middle portion adjacent to the central window hole, which is covered with the molding resin; the circuit board includes a first board surface on which the first circuit components are mounted so as to be located in the central window hole, and a second board surface corresponding to a rear surface of the first board surface, on which the second circuit components are mounted in an area opposed to the adjacent flat portion; the external connection terminals are connected to terminal connection electrodes provided on the second board surface; and the second circuit components are heat-generating components having a smaller height than a height of the first circuit components.

According to another aspect of the present invention, there is a method of fabricating the resin-sealed electronic controller comprising: a circuit-component mounting process of mounting the first circuit components and the second circuit components on the circuit board; an assembly and connection process of temporarily fixing temporary fixing pieces of terminal boards obtained by integrating the external connection terminals and the temporary fixing pieces through an intermediation of connection plates to the first exposed portion and the second exposed portion of the base plate, applying a thermally-curable or moisture-curable adhesive onto a surface of a part of the base plate to bond and fix the circuit board on which the first circuit components and the second circuit components are mounted in the circuit-component mounting process, and electrically connecting the external connection terminals and the terminal connection electrodes to each other to form an assembly; a resin-molding process of placing the assembly between the molding dies, injecting the heated and melted thermally-curable molding resin under pressure after pre-heating, and maintaining heating for a while after demolding; and a terminal-board cutting process of cutting the terminal boards to separate the temporary fixing pieces and the connection plates, wherein a boundary plane obtained by dividing a total thickness (T10) of the molding resin into T11=T10/2 and T12=T10/2, which are equal to each other in a thickness direction, is set to be located closer to a surface of the base plate, which is opposite to a surface of the base plate on which the circuit board is bonded.

According to the resin-sealed electronic controller of the present invention, the circuit board is bonded to one of the surfaces of the thermally-conductive base plate which has the central window hole formed therethrough, the adjacent flat portion, and the exposed portions. The first circuit components corresponding to the components with the large height provided so as to be located in the central window hole and the second circuit components corresponding to the heat-generating components located on an area corresponding to the adjacent flat portion are respectively mounted on the different board surfaces of the circuit board. Together with the external connection terminals, the above-mentioned boards and components are integrally molded with the molding resin.

Therefore, the heat generated from the heat-generating components is transferred and diffused to the entire base plate and is efficiently dissipated through the exposed portions. In addition, the circuit components having the large height are provided so as to be located in the central window hole portion. Therefore, the thickness dimension of the base plate at least partially overlaps the height dimension of the first circuit components. Thus, the effects of reducing the total thickness dimension can be obtained.

Further, the second circuit components corresponding to the heat-generating components are provided so as to be separated away from the first circuit components. Therefore, the effects of providing the first circuit components at a high density to increase a mounting density of the circuit board can be obtained.

Moreover, the external connection terminals are connected to the second board surface which is not brought into surface-contact with the base plate. Therefore, it is not necessary to provide an area to the periphery of the circuit board so as to project from the outer circumferential profile of the base plate. Therefore, the effects of reducing the entire plane area can be obtained.

The method of fabricating a resin-sealed electronic controller according to the present invention includes the circuit-component mounting process, the assembly and connection process for the circuit board, the terminal boards, and the base plate, the resin-molding process, and the process of cutting the terminal boards which connect the external connection terminals. A center position in the total thickness of the molding resin is located closer to the surface of the base plate, which is opposite to the surface bonded to the circuit board.

Therefore, the center position in the total thickness of the molding resin is set so as to be close to an intermediate position of the sum of the height dimension of the first circuit components, the thickness dimension of the circuit board, and the height dimension of the second circuit components. Thus, the integral molding is achieved without generating unevenness in the thickness as the outer covering material portions as viewed from the circuit board. As a result, the amount of molding resin material can be saved.

BRIEF DESCRIPTION OF THE DRAWINGS

FIG. 3 is a plan view illustrating the base plate of FIG. 1;

FIG. 4 is a plan view illustrating a state in which adhesives are applied onto the base plate illustrated in FIG. 3;

FIG. 23 is a flow chart illustrating a method of fabricating a resin-sealed electronic controller embodiment 2 of the present invention.

DETAILED DESCRIPTION OF THE PREFERRED EMBODIMENTS

Figure 1:
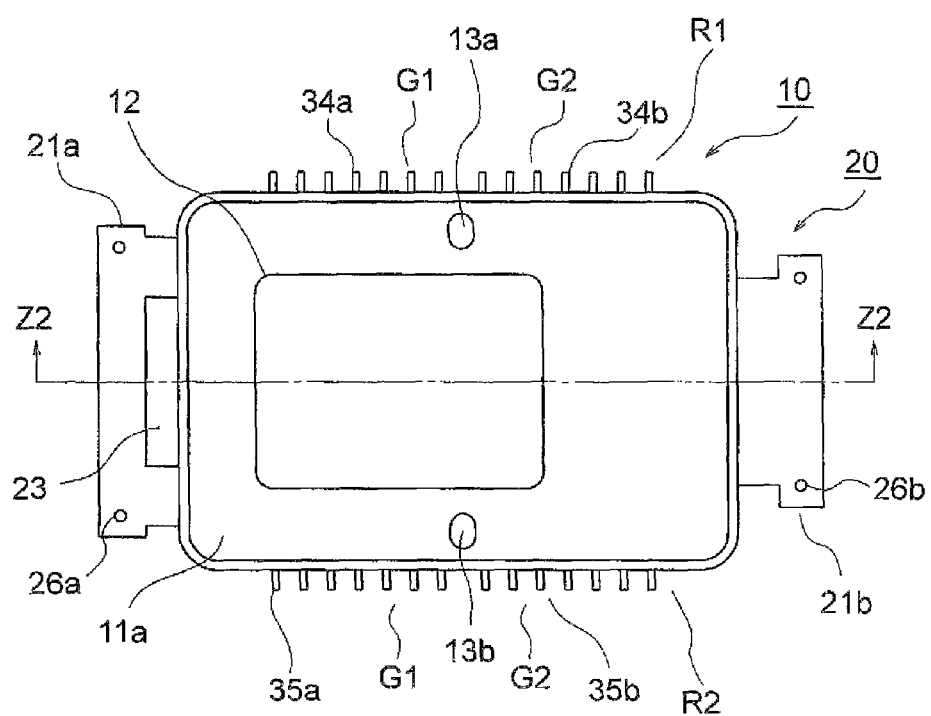
FIG. 1 is a plan view illustrating a resin-sealed electronic controller of embodiment 1 of the present invention.

Hereinafter, each embodiment of the present invention is described based on the accompanying drawings. In the drawings, the same or equivalent components and parts are denoted by the same reference symbols for description.

Embodiment 1

Figure 2:
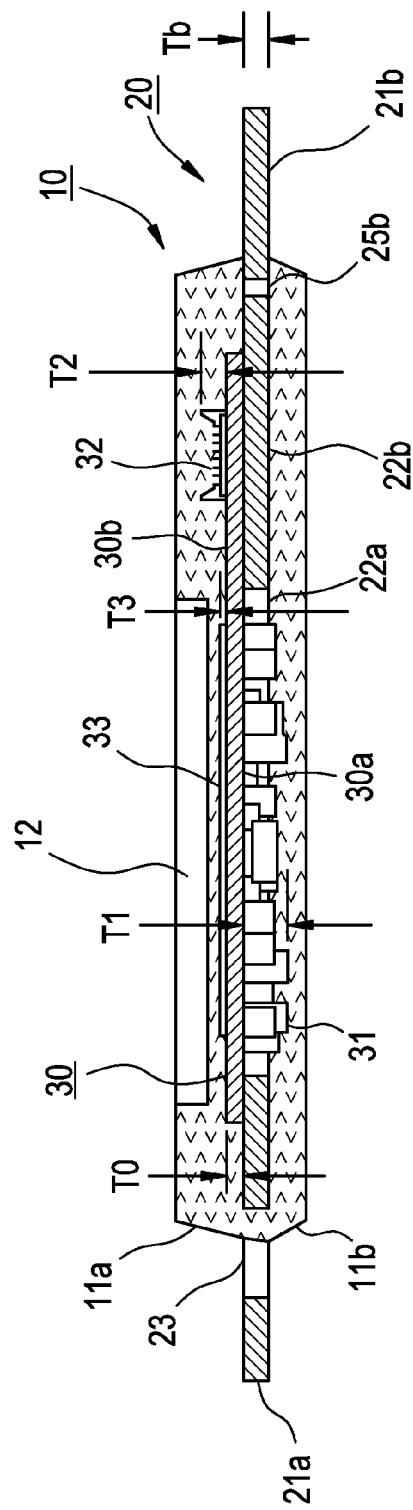
FIG. 2 is a sectional view taken along the line Z2-Z2 of FIG. 1 as viewed from the direction indicated with the arrows.

FIG. 1 is a plan view illustrating a resin-sealed electronic controller (hereinafter, referred to simply as "electronic controller") 10 according to Embodiment 1 of the present invention, and FIG. 2 is a sectional view taken along the line Z2-Z2 of FIG. 1 as viewed from the direction indicated with the arrows.

The electronic controller 1 includes a base plate 20, a circuit board 30, first circuit components 31, second circuit components 32, third circuit components 33, external connection terminals 34a, 34b, 35a, and 35b, and outer covering material portions 11a and 11b. The circuit board 30 is bonded to one surface of the base plate 20. The first circuit components 31, the second circuit components 32, and the third circuit components 33 are mounted onto the circuit board 30. The external connection terminals 34a, 34b, 35a, and 35b are electrically connected to the circuit board 30. The outer covering material portions 11a and 11b are formed by covering the circuit board 30 with a molding resin.

The base plate 20 illustrated in FIG. 3 is a thermally-conductive plywood obtained by, for example, laminating layers in the order of copper, invar, and copper and then pressure-bonding the layers with a press. The use of invar, which is an alloy of iron and nickel, is to make a linear expansion coefficient of the base plate 20 substantially equal to that of each of the outer covering material portions 11a and 11b and the circuit board 30.

The base plate 20 has a central window hole 22a formed in a central portion and includes a first exposed portion 21a, a second exposed portion 21b, an adjacent flat portion 22b, parallel window frame portions 22c, and a pair of portions 27A to be pressed. The first exposed portion 21a and the second exposed portion 21b are externally exposed and fixed to mounting portions. The pair of portions 27A to be pressed extend from the parallel window frame portions 22c in the directions opposite to each other.

In the first exposed portion 21a, a rectangular connection slit 23, small connection holes 24a and 25a, and positioning holes 26a are formed.

Similarly, in the second exposed portion 21b, small connection holes 24b and 25b and positioning holes 26b are formed.

The small connection holes 24a and 24b are formed in both longitudinal end portions of the base plate 20, whereas the small connection holes 25a are formed on both longitudinal sides of the connection slit 23.

Figure 9:
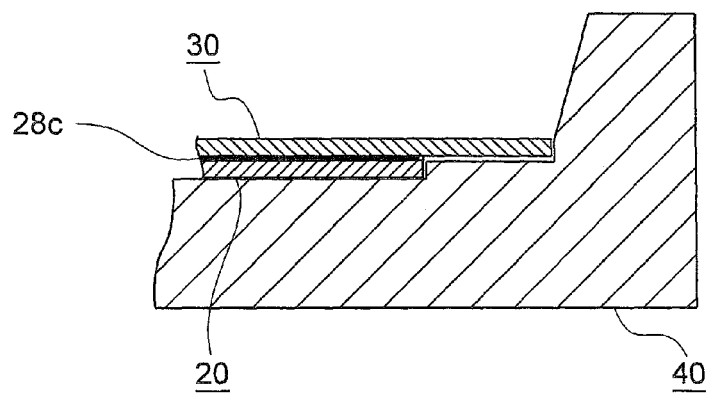
FIG. 9 is a sectional view taken along the line Z9-Z9 of FIG. 7 as viewed from the direction indicated with the arrows.

The small connection holes 25b are formed at a position symmetric to the position at which the connection slit 23 is provided. Positioning pins provided to a bonding jig 40 described below referring to FIG. 9 are inserted into the positioning holes 26a and 26b when the base plate 20 is placed on the bonding jig 40.

FIG. 4 is a plan view illustrating a state in which adhesives 28a, 28b, and 28c are applied onto the base plate 20 illustrated in FIG. 3.

The adhesive 28a is applied onto both longitudinal end portions of the first exposed portion 21a, whereas the adhesive 28b is applied onto both longitudinal end portions of the second exposed portion 21b.

The adhesive 28c is applied onto the adjacent flat portion 22b and the parallel window frame portions 22c.

As each of the adhesives 28a, 28b, and 28c, an adhesive whose adhesion is not lowered in a high-temperature environment during subsequent hot-forming processing, for example, a polyester thermally-curable adhesive or a moisture-curable adhesive is suitable.

The adhesive 28a applied onto the first exposed portion 21a and the adhesive 28b applied onto the second exposed portion 21b are respectively used for temporarily fixing both ends of terminal boards 34 and 35 described below referring to FIG. 7.

The adhesive 28c is used for bonding the base plate 20 to the circuit board 30.

Figure 5:
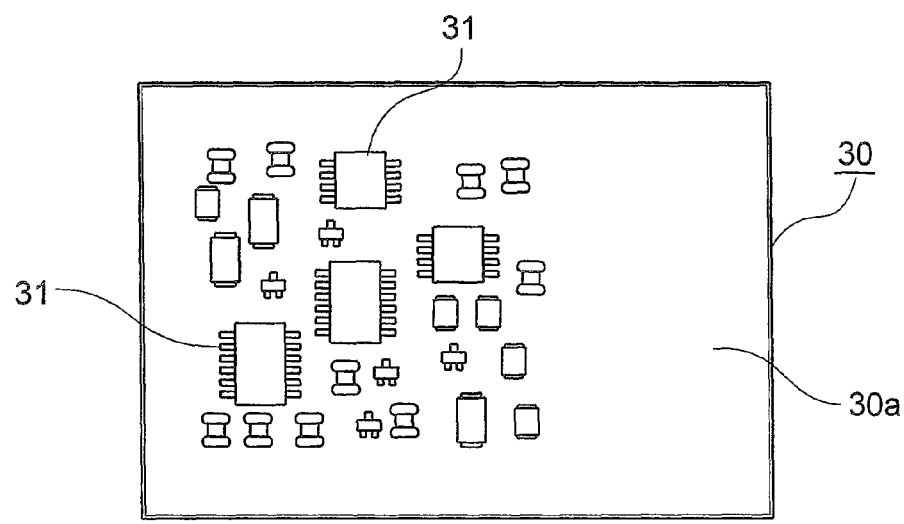
FIG. 5 is a plan view illustrating a first board as viewed the circuit board of FIG. 1 from the first board.
Figure 6:
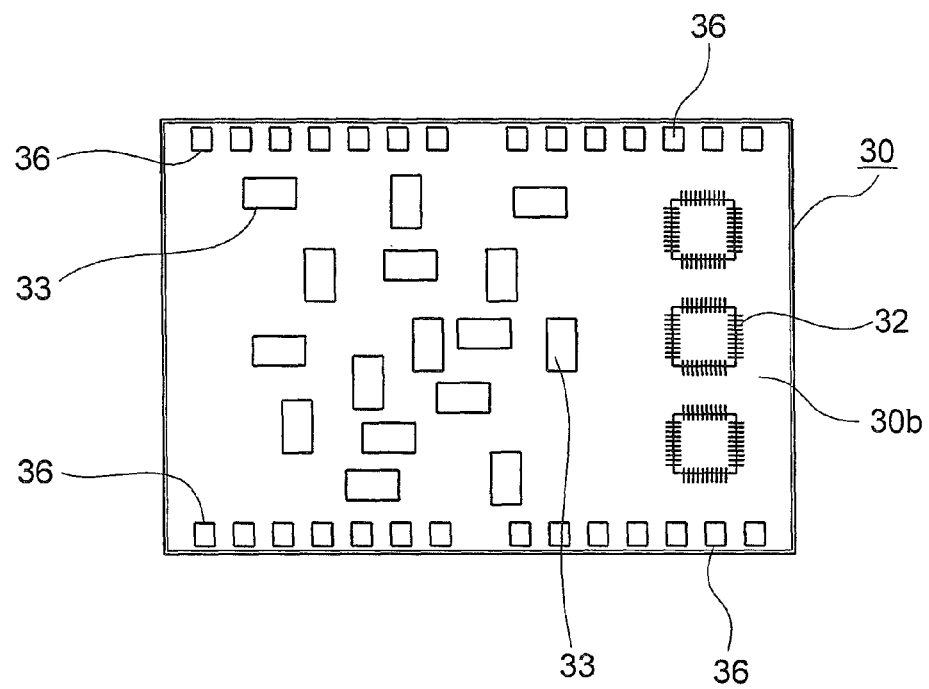
FIG. 6 is a plan view illustrating a second board as viewed the circuit board of FIG. 1 from the second board.

FIG. 5 is a plan view illustrating a first board surface 30a of the circuit board 30, and FIG. 6 is a plan view illustrating a second board surface 30b of the circuit board 30.

The first board surface 30a of the circuit board 30 is bonded to the base plate 20 by the adhesive 28c.

The rectangular circuit board 30 is made of, for example, a ceramic board. The plurality of first circuit components 31 are mounted onto the first board surface 30a. The first circuit components 31, which are low-heat-generating components having a large height, are provided so as to be located in the central window hole 22a of the base plate 20.

The plurality of second circuit components 32, which are heat-generating components having a small height, are mounted on the second board surface 30b, which is a rear surface of the first board surface 30a, in an area opposed to the adjacent flat portion 22b of the base plate 20. The third circuit components 33, which are thin planar resistive elements, are also mounted onto the second board surface 30b.

A plurality of terminal connection electrodes 36 are provided to each of both edge portions of the second board surface 30b at predetermined intervals along a longitudinal direction.

More specifically, the first circuit components 31 are components constituting an input/output interface circuit composed mainly of resistors and capacitors provided in a low electric-power signal circuit. The second circuit components 32 are high-density integrated circuit components including a power transistor, a power diode, and a microprocessor. The third circuit components 33 are a resistor for detecting a load current, a bleeder resistor for an input sensor, and the like.

Power consumption on the first board surface 30a and the second board surface 30b per unit area substantially has the following relation. The power consumption by the first circuit components 31 has the smallest value, whereas the power consumption by the second circuit components 32 has the largest value.

first circuit components 31<third circuit components 33<second circuit components 32

As the first circuit components 31, surface-mounted components are used. As the second circuit components, bare chip elements are used. As the third circuit components 33, printed resistors are used.

When T0 is a thickness of the circuit board 30, T1 is a height (maximum value) of the first circuit components 31, T2 is a height (maximum value) of the second circuit components 32, T3 is a height (maximum value) of the third circuit components 33, and Tb is a thickness of the base plate 20, the relations expressed by Formulae (1a) and (1b) are satisfied as mutual dimensional relations.

$$T0+T2 \leq (T1, Tb)\text{max} \tag{1a}$$

$$T3 \leq T2 < (T1, Tb)\text{min} < (T1, Tb)\text{max} \tag{1b}$$

where (T1, Tb)max is the larger value of one of T1 and Tb, and (T1, Tb)min is the smaller value of one of T1 and Tb.

As a result, a total thickness T obtained when the first circuit components 31, the second circuit components 32, and the third circuit components 33 are mounted onto the circuit board 30 is expressed by Formula (2).

$$T=(T1, Tb)\text{max}+T0+T2 \tag{2}$$

On the other hand, if all the circuit components 31, 32, and 33 are mounted onto the second board surface 30b, not only an area of the circuit board 30 is increased but a total thickness TA including the thickness of the circuit board 30 has a larger value as expressed by Formula (3).

$$TA = T0 + T1 + Tb = T + \{(T1+Tb)-(T1,Tb)\max\} - T2 = T + (T1,Tb)\min - T2 > T \quad (3)$$

The plurality of external connection terminals 34a, 34b, 35a, and 35b are respectively connected to the terminal connection electrodes 36 formed on the second board surface 30b.

As can be seen from FIG. 1, among the external connection terminals 34a, 34b, 35a, and 35b, the external connection terminals 34a and 34b form a first row R1, whereas the external connection terminals 35a and 35b form a second row R2.

The first row R1 and the second row R2 are parallel to each other. In the first row R1, a first group G1 constituted of the plurality of external connection terminals 34a and a second group G2 constituted of the plurality of external connection terminals 34b are horizontally separated away from each other by a space corresponding to one external connection terminal. Similarly, in the second row R2, a first group G1 constituted of the plurality of external connection terminals 35a and a second group G2 constituted of the plurality of external connection terminals 35b are horizontally separated away from each other by a space corresponding to one external connection terminal.

The outer covering material portion 11a present above the base plate 20 and the outer covering material portion 11b present below the base plate 20 are integrated with each other through the connection slit 23 and the small connection holes 24a, 24b, 25a, and 25b formed through the base plate 20. By the integration, the outer covering material portions 11a and 11b are prevented from separating at the boundaries with the base plate 20.

A recess portion 12 having a small thickness is formed in the outer covering material portion 11a in an area corresponding to the area in which the third circuit components 33 are provided. Heat generated from the third circuit components 33 is efficiently dissipated from the recess portion 12.

Figure 7:
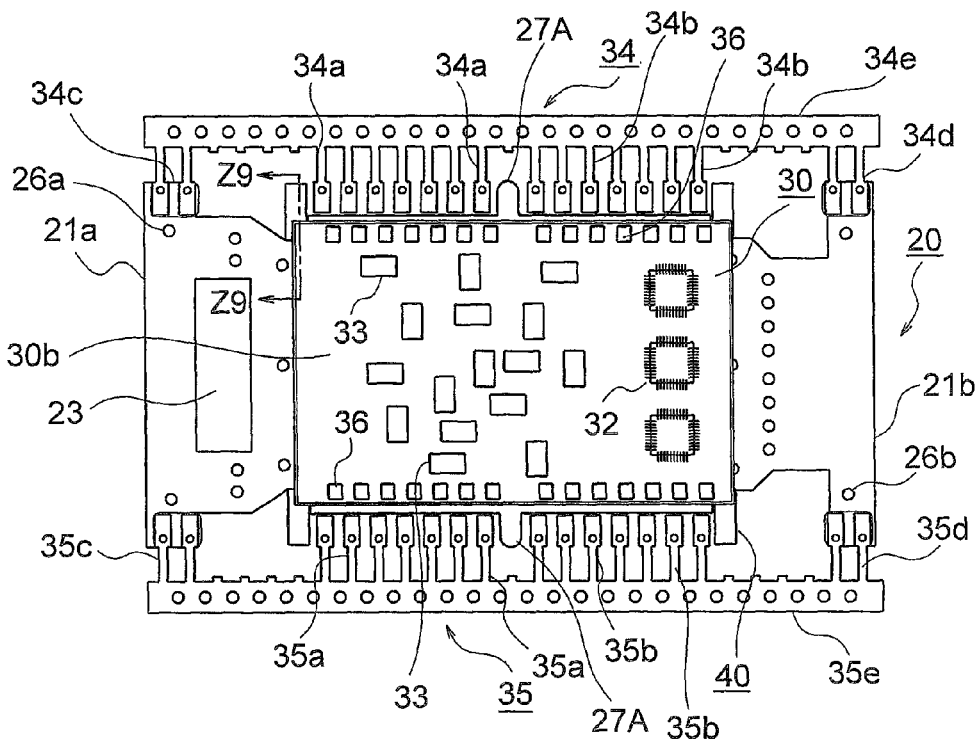
FIG. 7 is a plan view illustrating a semi-finished assembly in which the circuit board, the base plate and a terminal board in FIG. 1 are bonded.
Figure 8:
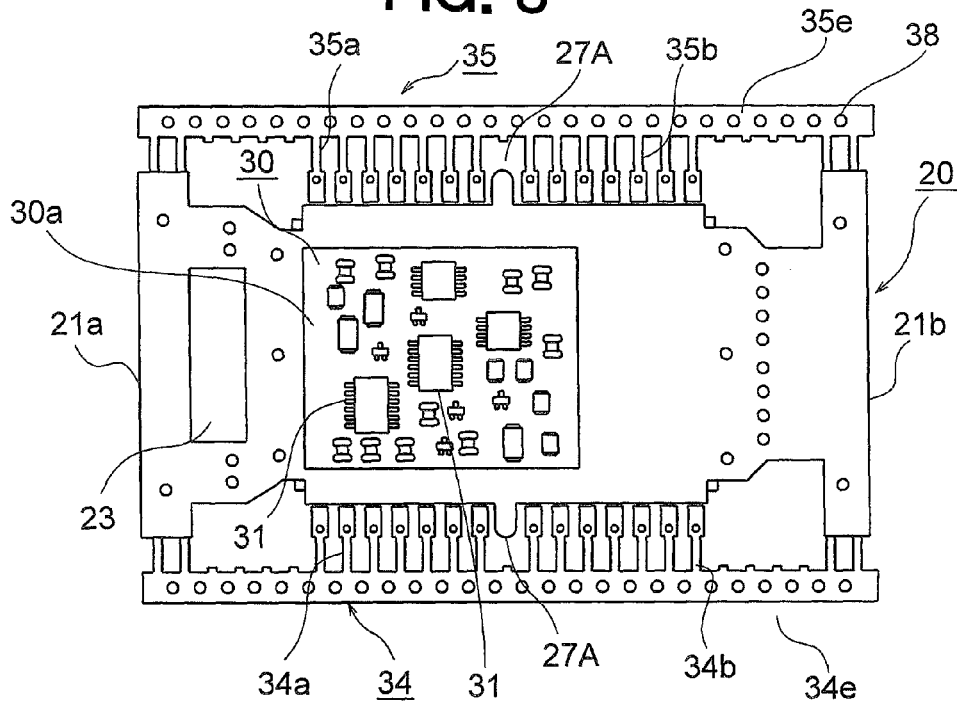
FIG. 8 is a plan view illustrating a rear surface of FIG. 7.

FIG. 7 is a plan view illustrating a semi-finished assembly obtained in the middle of a fabrication process of the electronic controller 10, and FIG. 8 is a plan view illustrating a rear surface of FIG. 7.

The semi-finished assembly is constituted by integrating the base plate 20, the circuit board 30, a first terminal board 34, and a second terminal board 35.

The first terminal board 34 includes a connection plate 34e, the plurality of external connection terminals 34a and 34b, and temporary fixing pieces 34c and 34d. The plurality of external connection terminals 34a and 34b extend from the connection plate 34e so that distal end portions thereof extend toward the circuit board 30. The temporary fixing pieces 34c and 34d are respectively provided on both end portions of the connection plate 34e so that distal end portions thereof extend toward the base plate 20.

The second terminal board 35 includes a connection plate 35e, the plurality of external connection terminals 35a and 35b, and temporary fixing pieces 35c and 35d. The plurality of external connection terminals 35a and 35b extend from the connection plate 35e so that distal end portions thereof extend toward the circuit board 30. The temporary fixing pieces 35c and 35d are respectively provided on both end portions of the connection plate 35e so that distal end portions thereof extend toward the base plate 20.

Each of the temporary fixing pieces 34c, 34d, 35c, and 35d has the same shape as that of the external connection terminals 34a, 34b, 35a, and 35b. The temporary fixing pieces 34c, 34d, 35c, and 35d are respectively provided so as to be separated away from the external connection terminals 34a, 34b, 35a, and 35b, which are adjacent thereto, by a distance over which four of the external connection terminals 34a, 34b, 35a, or 35b can be provided.

The temporary fixing pieces 34c, 34d, 35c, and 35d are respectively bonded to both end portions of the first exposed portion 21a and the second exposed portion 21b by the adhesives 28a and 28b.

FIG. 9 is a sectional view taken along the line Z9-Z9 of FIG. 7 as viewed from the direction indicated by the arrows.

The semi-finished assembly is positioned on the bonding jig 40 through the positioning holes 26a and 26b formed through the base plate 20. The circuit board 30, the first terminal board 34, and the second terminal board 35 are pressed against the base plate 20 placed on the bonding jig 40. As a result, the semi-finished assembly in which the base plate 20, the circuit board 30, the first terminal board 34, and the second terminal board 35 are integrated through an intermediation of the adhesives 28a, 28b, and 28c is fabricated.

Figure 10:
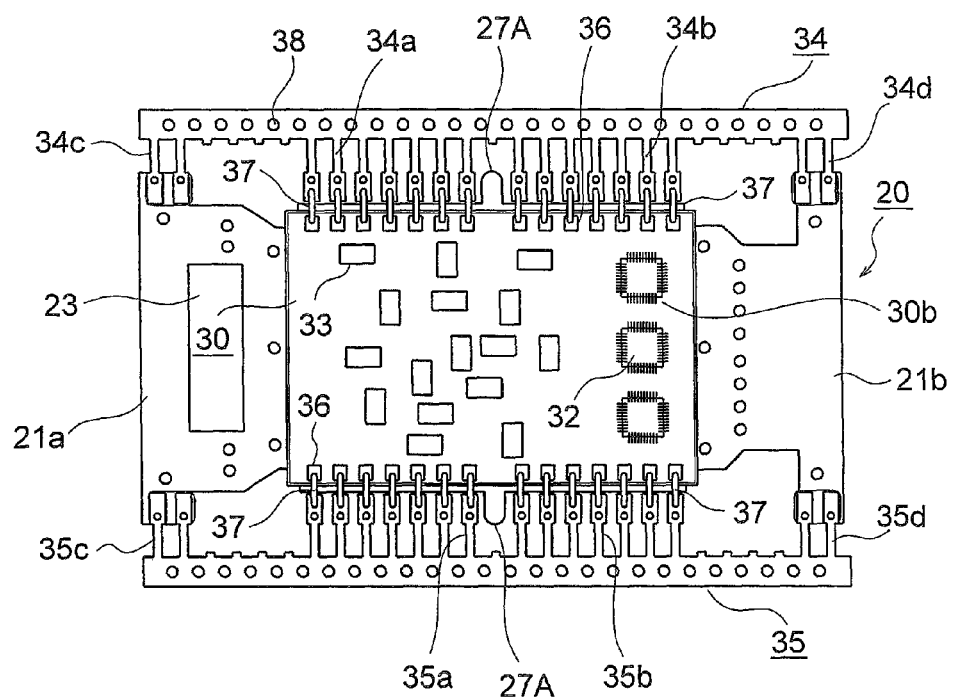
FIG. 10 is a plan view illustrating an assembly in which a circuit board and an external connection terminal in FIG. 7 are bonded with a bonding wire.

FIG. 10 is a plan view illustrating an assembly obtained by connecting the terminal connection electrodes 36 provided on the circuit board 30 and the distal end portions of the external connection terminals 34a, 34b, 35a, and 35b in the semi-finished assembly illustrated in FIG. 7 with bonding wires 37, each being an aluminum wire.

Figure 11:
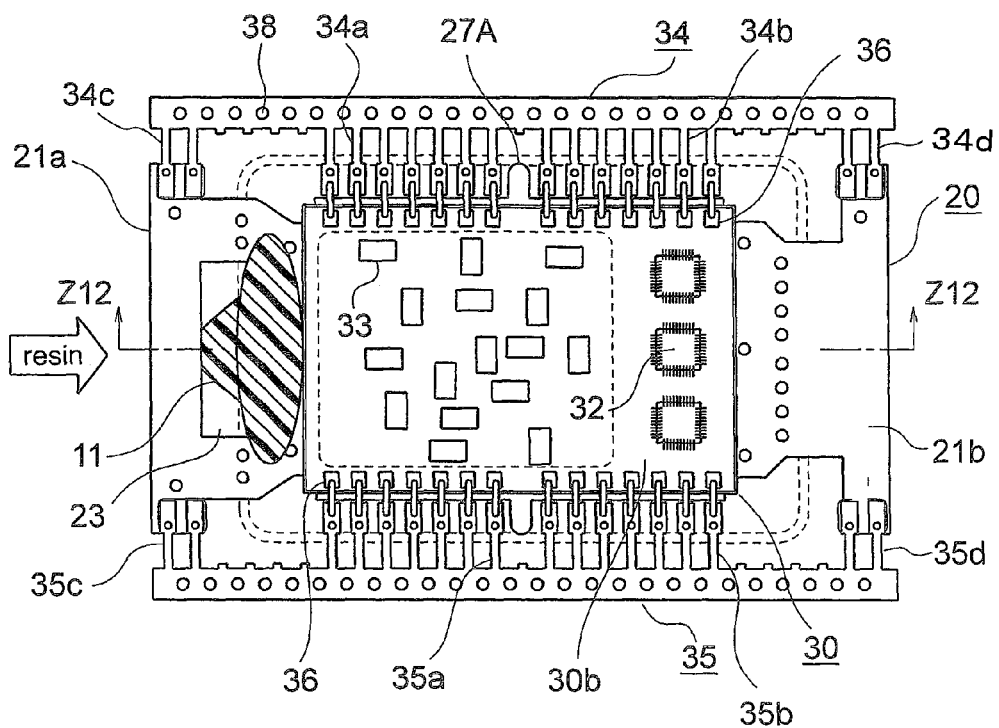
FIG. 11 is a plan view illustrating the interior of molding dies when the assembly illustrated in FIG. 10 is molded with a resin.
Figure 12:
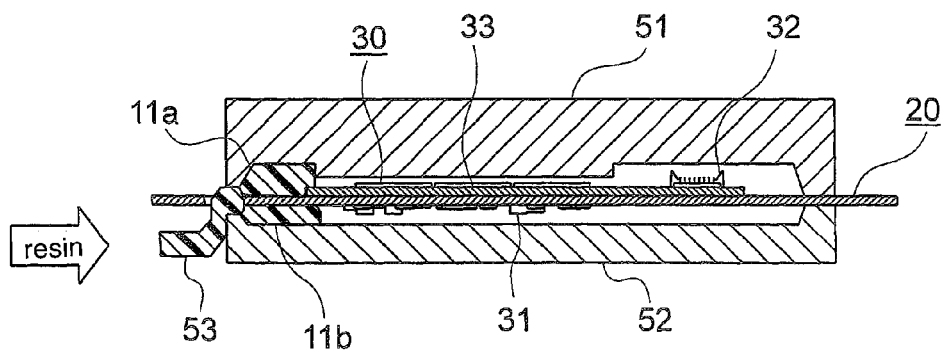
FIG. 12 is a sectional view taken along the line Z12-Z12 of FIG. 11 as viewed from the direction indicated by the arrows.

FIG. 11 is a plan view illustrating the interior of molding dies 51 and 52 when the assembly illustrated in FIG. 10 is molded with a resin, and FIG. 12 is a sectional view taken along the line Z12-Z12 of FIG. 11 as viewed from the direction indicated by the arrows.

An injection port 53 having a distal end portion exposed to the connection slit 23 is provided to the molding dies 51 and 52. A molding resin 11, which is heated to be melted, is injected under pressure through the injection port 53. As a result, the outer covering material portions 11a and 11b are formed.

Figure 13A:
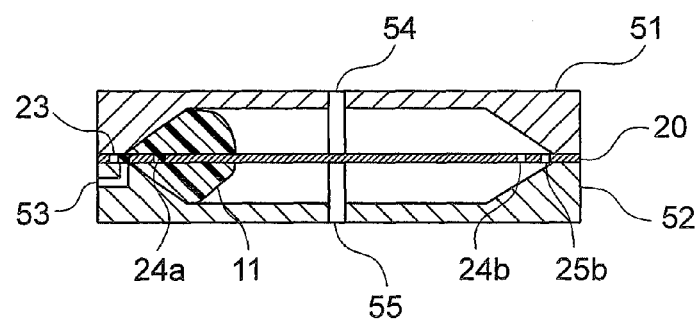
FIG. 13A-FIG. 13C are sectional views of molding dies illustrating the move of the movable pins.
Figure 13B:
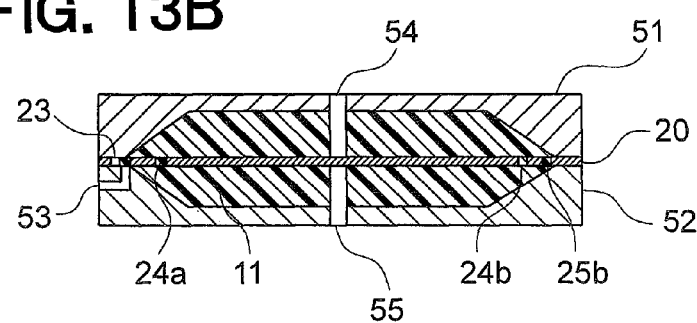
Figure 13C:
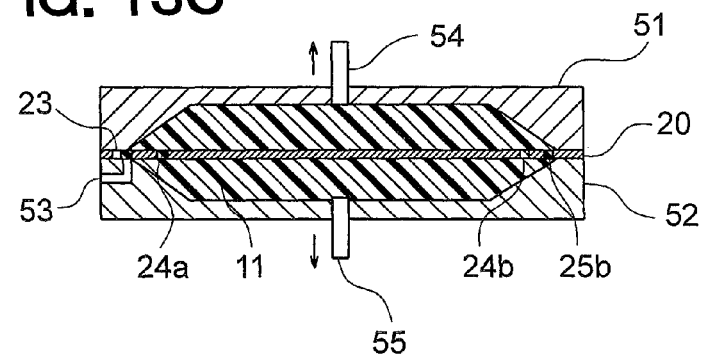

The molding dies 51 and 52 respectively include movable pins 54 and 55 illustrated in FIGS. 13A to 13C. The movable pins 54 and 55 press and sandwich the portions 27A to be pressed illustrated in FIG. 3 or portions 27B to be pressed described below referring to FIG. 22 so as to prevent the deformation of the base plate 20.

After the states illustrated in FIGS. 13A and 13B, the movable pins 54 and 55 are removed at the time of completion of the injection of the molding resin 11. Spaces formed by removing the movable pins 54 and 55 are filled with the heated and melted molding resin 11 as illustrated in FIG. 13C.

Figure 14:
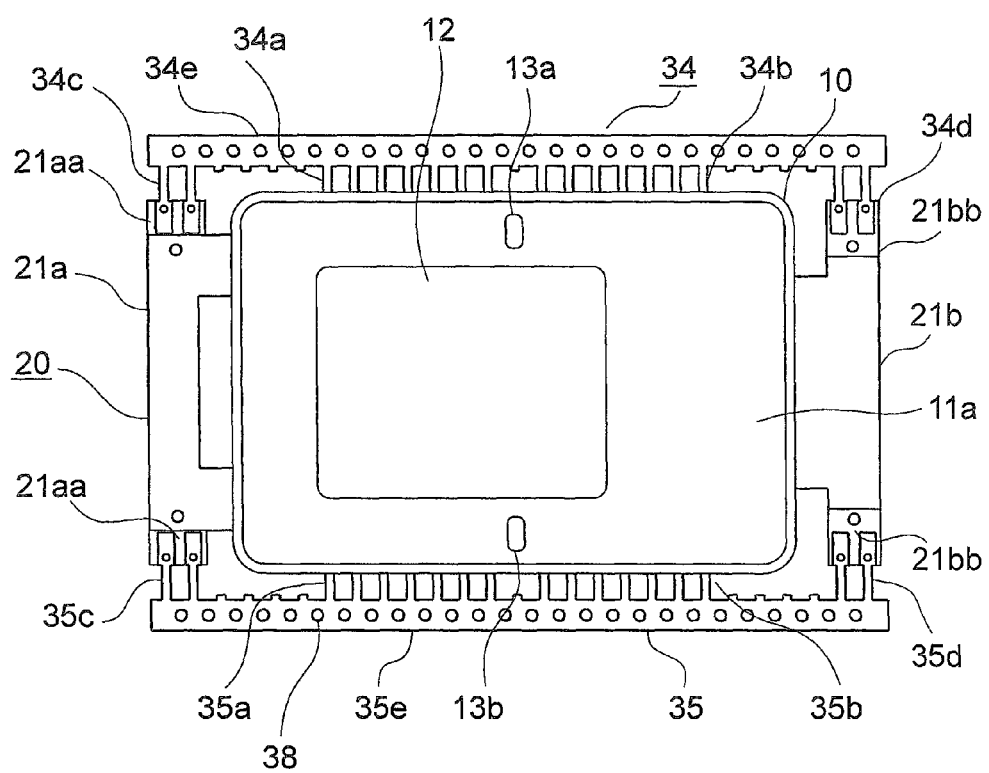
FIG. 14 is a plan view illustrating a semi-finished product in which the assembly of FIG. 10 is integrated with a molding resin.

FIG. 14 is a plan view illustrating a semi-finished product demolded from the molding dies 51 and 52.

In the semi-finished product, cutoff areas 21aa of the first exposed portion 21a, cutoff areas 21bb of the second exposed portion 21b, and the distal end portions of the external connection terminals 34a, 34b, 35a, and 35b are cut so that the connection plate 34e is removed from the first terminal board 34 and the connection plate 35e is removed from the second terminal board 35. As a result, only the external connection terminals 34a and 34b of the first terminal board 34 and the external connection terminals 35a and 35b of the second terminal board 35 are left.

Movable-pin hole marks 13a and 13b are hole marks formed after the spaces formed by removing the movable pins 54 and 55 as illustrated in FIG. 13C are filled with the melted molding resin 11.

The resin-sealed electronic controller 10 according to the embodiment described above includes: the circuit board 30 on which the plurality of circuit components 31 and 32 are mounted; the thermally-conductive base plate 20 bonded to the circuit board 30; the plurality of external connection terminals 34a, 34b, 35a, and 35b connected to the circuit board 30; and the molding resin 11 for covering the entire circuit board 30 and a part of the external connection terminals 34a, 34b, 35a, and 35b and the base plate 20 to form the outer covering material portions 11a and 11b, the resin-sealed electronic controller 10 being formed by integral molding with the molding resin 11. Further, the base plate 20 includes the central window hole 22a formed in the middle portion, the first exposed portion 21a and the second exposed portion 21b exposed to exterior and fixed to the mounting portions, and the adjacent flat portion 22b adjacent to the central window hole. The circuit board 30 includes the first board surface 30a on which the first circuit components 31 are mounted so as to be located in the central window hole 22a, and the second board surface 30b corresponding to a rear surface of the first board surface 30a, on which the second circuit components 32 are mounted in an area opposed to the adjacent flat portion 22b. The external connection terminals 34a, 34b, 35a, and 35b are connected to the terminal connection electrodes 36 provided on the second board surface 30b, and the second circuit components 32 are heat-generating components having a smaller height than a height of the first circuit components 31.

As described above, the circuit board 30 is bonded to one of the surfaces of the thermally-conductive base plate 20 which has the central window hole 22a formed therethrough, the adjacent flat portion 22b, and the exposed portions 21a and 21b. The first circuit components 31 corresponding to the components with the large height provided so as to be located in the central window hole 22a and the second circuit components 32 corresponding to the heat-generating components located on an area corresponding to the adjacent flat portion 22b are respectively mounted on the different board surfaces 30a and 30b of the circuit board 30. Together with the external connection terminals 34a, 34b, 35a, and 35b, the above-mentioned boards and components are integrally molded with the molding resin 11.

Therefore, the heat generated from the second circuit components 32 corresponding to the heat-generating components can be transferred and diffused to the entire base plate 20 and efficiently dissipated through the exposed portions 21a and 21b exposed to exterior. In addition, the first circuit components 31 having the large height are provided so as to be located in the central window hole 22a. Therefore, the thickness dimension of the base plate 20 at least partially overlaps the height dimension of the first circuit components 31. Thus, the effects of reducing the total thickness dimension can be obtained.

Further, the second circuit components 32 corresponding to the heat-generating components are provided so as to be separated away from the first circuit components 31. Therefore, the effects of providing the first circuit components 31 corresponding to the low-heat-generating components at a high density to increase a mounting density of the circuit board 30 can be obtained.

Moreover, the external connection terminals 34a, 34b, 35a, and 35b are connected to the second board surface 30b which is not brought into surface-contact with the base plate 20. Therefore, it is not necessary to provide an area to the periphery of the circuit board 30 so as to project from the outer circumferential profile of the base plate 20. Therefore, the effects of reducing the entire plane area can be obtained.

A value T0+T2 corresponding to the sum of the thickness dimension T0 of the circuit board 30 and the height dimension T2 of the second circuit components 32 is a dimension equal to or smaller than the dimension (Tb, T1)max which is larger one of the thickness dimension Tb of the base plate 20 and the height dimension T1 of the first circuit components 31. The first circuit components 31 are the surface-mounted components which are electrically connected to the circuit board 30 in the first board surface 30a. The second circuit components 32 are the thin heat-generating components having a bare-chip structure, which are electrically connected to the circuit board 30 in the second board surface 30b. The third circuit components 33, each having a smaller height than those of the second circuit components 32, are mounted onto the second board surface 30b at a position corresponding to the position on the first board surface 30a at which the first circuit components 31 are provided.

As described above, the second circuit components 32 and the third circuit components 33, each having a small height, are mounted onto the second board surface 30b, whereas the first circuit components 31, each having a larger height which is equal to or smaller than the thickness dimension of the base plate 20, are mounted onto the first board surface 30a which is different from the second board surface 30b. In addition, the third circuit components 33 are mounted onto the second board surface 30b at the position corresponding to the position on the first board surface 30a at which the first circuit components 31 are provided.

Therefore, the total thickness dimension of the product can be reduced. In addition, the first circuit components 31 and the third circuit components 33 are respectively mounted onto the two surfaces of the circuit board 30. As a result, the area of the circuit board 30 can be reduced.

Moreover, the circuit board 30 is formed of a ceramic board. The third circuit components 33 are thin planar resistive elements.

Thus, the heat generated from the resistive elements is not locally concentrated but is transferred and diffused to the base plate 20 through an intermediation of the highly thermally-conductive ceramic board. In addition, the heat is dissipated to outside air through an intermediation of the outer covering material portions 11a and 11b.

The plurality of external connection terminals 34a, 34b, 35a, and 35b are arranged in parallel to a direction in which the central window hole 22a and the adjacent flat portion 22b are arranged. Moreover, the external connection terminals 34a, 34b, 35a, and 35b are arranged separately in the first row R1 constituted of the external connection terminals 34a and 34b and the second row R2 constituted of the external connection terminals 35a and 35b. The first row R1 is further separated into the first group G1 constituted of the external connection terminals 34a and the second group G2 constituted of the external connection terminals 34b, whereas the second row R2 is similarly separated into the first group G1 constituted of the external connection terminals 35a and the second group G2 constituted of the external connection terminals 35b.

The portions 27A to be pressed are respectively provided to the parallel window frame portions 22c of the base plate 20, which correspond to a peripheral edge portion of the central window hole 22a and are parallel to the external connection terminals 34a, 34b, 35a, and 35b. Each of the portions 27A to be pressed is provided between the first group G1 and the second group G2. The portions 27A to be pressed are pressed and interposed between the molding dies 51 and 52 when the molding resin 11 is injected into the space between the molding dies 51 and 52 to form the outer covering material portions 11a and 11b.

As described above, the portions 27A to be pressed, which are vertically pressed and interposed between the upper and lower molding dies at the time of mold processing, are provided to the window frame portions 22c of the central window hole 22a provided through the base plate 20.

Thus, although the formation of the central window hole 22a lowers strength of the base plate 20, the portions 27A to be pressed can prevent the base plate 20 from being deformed at the time of mold processing.

Moreover, the connection slit 23 is formed through the base plate 20 between the first exposed portion 21a and the central window hole 22a. In addition, the plurality of small connection holes 24b and 25b are formed between the second exposed portion 21b and the adjacent flat portion 22b. The outer covering material portion 11a, corresponding to one of the outer covering material portions, and the other covering material portion 11b are connected through the connection slit 23, the small connection holes 24b and 25b, while interposing the base plate 20 therebetween.

As described above, the connection slit 23 is formed through the base plate 20 on the side of the central window hole 22a, which is closer to the first exposed portion 21a. The small connection holes 24b and 25b are formed through the base plate 20 on the side of the adjacent flat portion 22b, which is closer to the second exposed portion 21b.

Therefore, the upper outer covering material portion 11a and the lower outer covering material portion 11b are connected to each other through the connection slit 23 and the small connection holes 24b and 25b. As a result, the separation therebetween is unlikely to occur.

Moreover, the plurality of small connection holes 24b and 25b are formed between the second exposed portion 21b and the adjacent flat portion 22b. Therefore, when the heat generated from the second circuit components 32 mounted on the circuit board 30 in the area of the adjacent flat portion 22b is transferred to the second exposed portion 21b, the connection slit 23, which has a large spatial area to narrow a thermal path, is not present in the middle of a transfer path of the heat. Therefore, the heat generated from the second circuit components 32 is smoothly transferred to the second exposed portion 21b.

Referring to FIG. 7, the first terminal board 34 is designed so that each of an interval (pitch) between the temporary fixing pieces 34c and the adjacent external connection terminal 34a belonging to the first group G1, an interval (pitch) between the first group G1 constituted of the external connection terminals 34a and the second group G2 constituted of the external connection terminals 34b, and an interval (pitch) between the temporary fixing pieces 34d and the adjacent external connection terminal 34b belonging to the second group G2 is an integral multiple of the interval (pitch) of the adjacent external connection terminals 34a and 34b.

The second terminal board 35 is designed in the same fashion as that of the first terminal board 34.

Each of the temporary fixing pieces 34c, 34d, 35c, and 35d has the same shape as that of each of the external connection terminals 34a, 34b, 35a, and 35b.

Moreover, the cutoff areas 21aa and 21bb are respectively provided to the first exposed portion 21a and the second exposed portion 21b. The external connection terminals 34a, 34b, 35a, and 35b are connected to the terminal connection electrodes 36 provided in both lateral edge portions of the circuit board 30 in a state in which the temporary fixing pieces 34c, 34d, 35c, and 35d are temporarily fixed to the cutoff areas 21aa and 21bb.

Moreover, the terminal boards 34 and 35 are temporarily fixed to the cutoff areas 21aa and 21bb of the base plate 20 by the adhesives 28a and 28b. The adhesives 28a and 28b are applied onto the base plate 20 together with the adhesive 28c for bonding and fixing the circuit board 30 to the base plate 20.

Therefore, the terminal boards 34 and 35 can be temporarily fixed in a simple manner simultaneously with the bonding of the circuit board 30.

Figure 15:
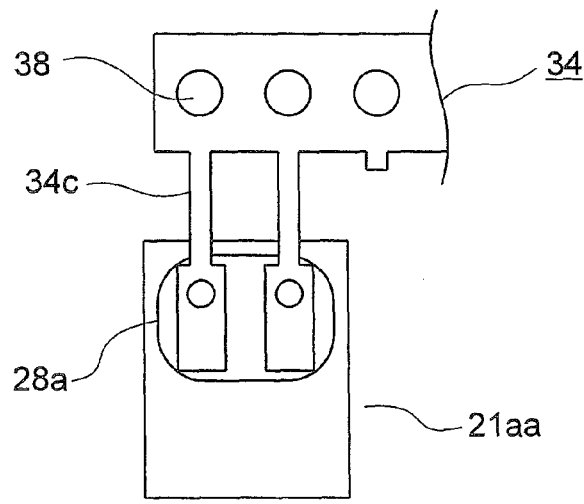
FIG. 15 is an enlarged view of a principal part of FIG. 10.

As illustrated in FIG. 15 which is an enlarged view of a principal part of FIG. 14, the first terminal board 34 and the second terminal board 35 are temporarily fixed to the base plate 20 by using the adhesives 28a and 28b, respectively, in the electronic controller 10 according to the embodiment described above. However, the first terminal board 34 and the second terminal board 35 may be temporarily fixed as described in the following example.

Figure 16A:
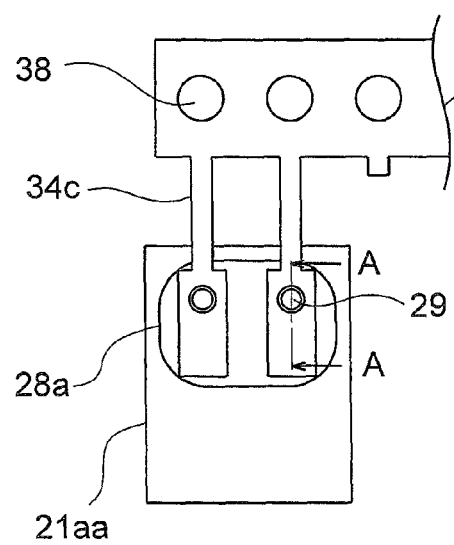
FIG. 16A is an enlarged view of a principal part of a modification in which a terminal board is temporarily fixed to a base plate.
Figure 16B:
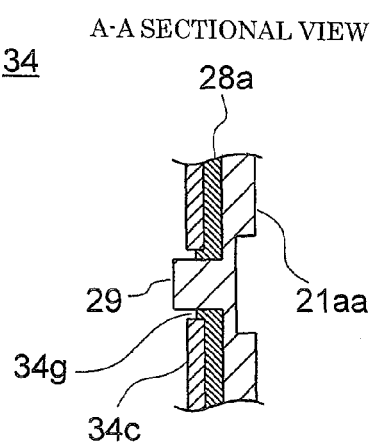
FIG. 16B is a sectional view taken along the line A-A of FIG. 16A as viewed from the direction indicated by the arrows.

FIG. 16A is a plan view of the cutoff area 21aa, and FIG. 16B is a sectional view taken along the line A-A of FIG. 16A as viewed from the direction indicated by the arrows.

In this example, a projection 29 is loosely inserted into a positioning hole 34g of each of the temporary fixing pieces 34c. The projections 29 temporarily fix the temporary fixing pieces 34c to the cutoff area 21aa of the first exposed portion 21a in addition to the adhering effects of the adhesive 28a.

Figure 17A:
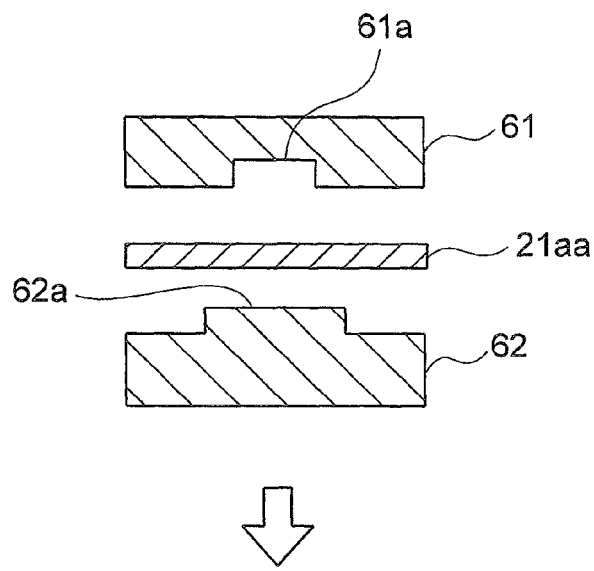
FIG. 17A is a view before forming a projection by molding dies, FIG. 17 B is a view after forming a projection by molding dies.
Figure 17B:
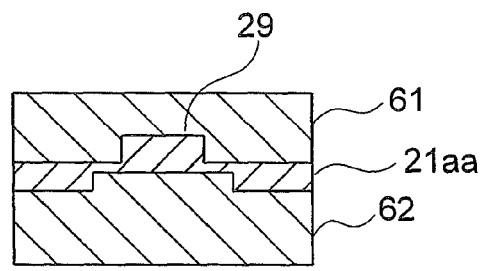

The projection 29 is fabricated in the following manner as illustrated in FIGS. 17A and 17B. An upper die 61 for forming the projection has a deep concave portion 61a having a small diameter. A lower die 62 for forming the projection has a convex portion 62a with a small height and a large diameter. Each of the cutoff areas 21aa and 21bb of the base plate 20 is sandwiched and pressed between the upper die 61 and the lower die 62 (FIG. 17A). As a result, each of the cutoff areas 21aa and 21bb is formed by being pushed by the convex portion 62a having the large diameter to fill the concave portion 61a having the small diameter (FIG. 17B).

Figure 18A:
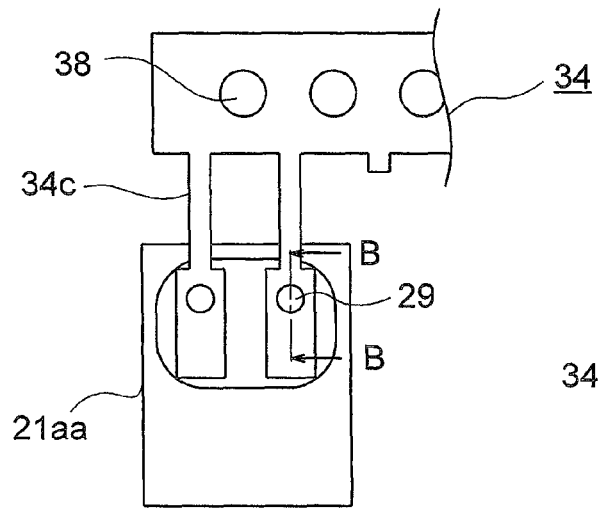
FIG. 18A is an enlarged view of a principal part of other modification in which a terminal board is temporarily fixed to a base plate.
Figure 18B:
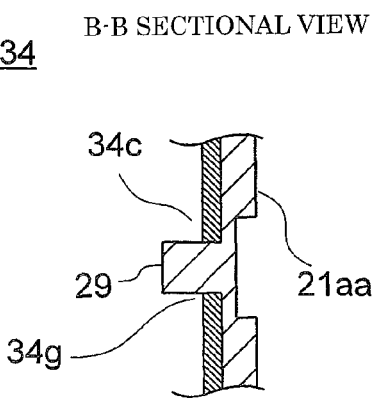
FIG. 18B is a sectional view taken along the line B-B of FIG. 18A as viewed from the direction indicated by the arrows.

FIG. 18A is a plan view of the cutoff area 21aa, and FIG. 18B is a sectional view taken along the line B-B of FIG. 18A as viewed from the direction indicated by the arrows.

In this example, the temporary fixing pieces 34c of the first terminal board 34 are temporarily fixed by fitting the projections 29 into the positioning holes 34g without using the adhesive 28a to the cutoff area 21aa of the first exposed portion 21a.

Figure 19A:
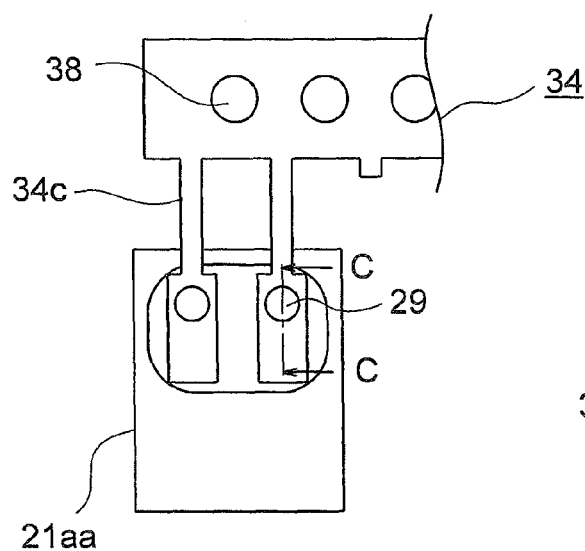
FIG. 19A is an enlarged view of a principal part of further other modification in which a terminal board is temporarily fixed to a base plate.
Figure 19B:
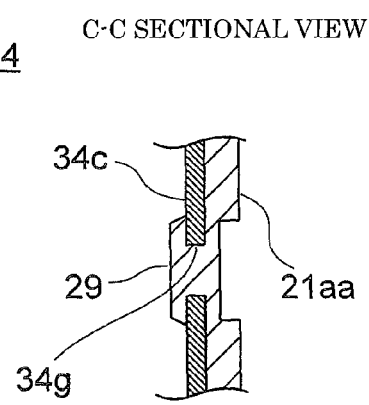
FIG. 19B is a sectional view taken along the line C-C of FIG. 18A as viewed from the direction indicated by the arrows.

Further, FIG. 19A is a plan view of the cutoff area 21aa, and FIG. 19B is a sectional view taken along the line C-C of FIG. 19A as viewed from the direction indicated by the arrows.

In this example, a distal end surface of the projection 29 is pressed to be flattened so as to temporarily fix each of the temporary fixing pieces 34c to the cutoff area 21aa.

Even in the above-mentioned examples, the temporary fixing pieces 34c and 34d of the first terminal board 34 and the external connection terminals 34a and 34b have the same shape. Similarly, the temporary fixing pieces 35c and 35d of the second terminal board 35 and the external connection terminals 35a and 35b have the same shape. The connection plates 34e and 35e are cut and separated from the elongated terminal boards 34 and 35, and some of the external connection terminals 34a, 34b, 35a, and 35b are cut and removed. As a result, a desired number of the external connection terminals 34a, 34b, 35a, and 35b can be easily obtained.

In the electronic controller 10 according to Embodiment 1 described above, as illustrated in FIG. 20 which is an enlarged view of a principal part of FIG. 7, each of the connection plates 34e and 35e is cut along a cut plane 160 corresponding to the distal end portions of the external connection terminals 34a, 34b, 35a, and 35b. As illustrated in FIG. 21, however, a cutting position may be different from that of the terminal boards 34 and 35 illustrated in FIG. 20.

In the case of the terminal boards 34 and 35 of the example illustrated in FIG. 21, connection plates 34f and 35f are provided inside the distal end positions of the external connection terminals 34a and 35a. The connection plates 34f and 35f are cut along first cut planes 161 and second cut planes 162 along a direction in which the external connection terminals 34a, 34b, 35a, and 35b extend.

Similarly to the connection plates 34e and 35e, perforations 38, which are required for the press working of the terminal boards 34 and 35, are formed through the connection plates 34f and 35f.

Figure 22:
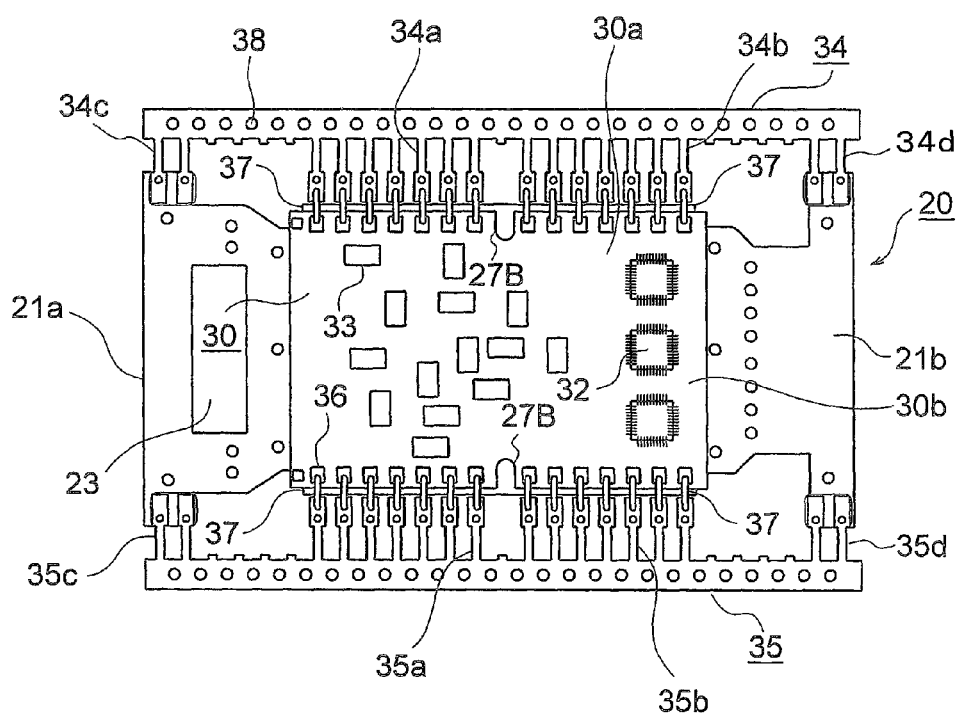
FIG. 22 is a plan view illustrating an assembly in which the location of the portion to be pressed of the base plate is different.

Moreover, as can be seen from FIG. 3, the portions 27A to be pressed, which project vertically outward from the edge portions of the base plate 20, extending along the longitudinal direction, are formed in the electronic controller 10 according to Embodiment 1 described above. Even without additionally providing the portions 27A to be pressed, as illustrated in FIG. 22, parts of the parallel window frame portions 22c of the base plate 20, which are exposed through U-shaped notches provided to the circuit board 30, may be used as portions 27B to be pressed.

Embodiment 2

Next, an example of a method of fabricating the electronic controller 10 according to the present invention is described based on a flowchart illustrated in FIG. 23.

The electronic controller 10 is fabricated in the order of a circuit-board fabrication process 110a, a circuit-component mounting process 110b, an assembly and connection process 120, a resin molding process 130, and a terminal-board cutting process 140.

In the circuit-board fabrication process 110a, a circuit pattern is formed on the ceramic board to form the circuit board 30. During the fabrication of the circuit board 30, the printed resistors corresponding to the third circuit components 33 are also formed by baking.

Then, an assembly operation is started for the carried-in circuit board 30 alone (Step 100).

In the circuit-component mounting process 110b, a solder paste is applied onto the first board surface 30a. The surface-mounted components corresponding to the first circuit components 31 are mounted on the applied solder paste and soldered thereon by heating and melting (Step 111; see FIG. 5).

Subsequently, the bare chip components corresponding to the second circuit components 32 are mounted onto the second board surface 30b, temporarily fixed by the adhesives, and connected to component connection electrodes (not shown) provided on the second board surface 30b by the bonding wires (Step 112; see FIG. 6).

When the second circuit components 32 have a ground electrode with a large width, the ground electrodes and the electrodes provided on the circuit board side are bonded and connected by a solder or an electrically conductive paste to achieve the temporary fixture.

In the assembly and connection process 120 subsequent to the circuit-component mounting process 110b, the base plate 20 having the projections 29 (see FIGS. 17A and 17B) formed by the press working is carried in. The distal end surfaces of the projections 29 are pressed to be flattened to temporarily fix the terminal boards 34 and 35 to the base plate 20 (Step 121a; see FIG. 19).

Subsequently, the adhesive 28c is applied onto the base plate 20 (Step 121b; see FIG. 4).

In the case where the temporary fixing pieces 34c and 35c are bonded to the cutoff areas 21 as of the first exposed portion 21a and the cutoff areas 21bb of the second exposed portion 21b, the adhesive 28a is applied to the cutoff areas 21 as while the adhesive 28b is applied to the cutoff areas 21 bb (see FIG. 4).

Next, the base plate 20, on which the adhesive 28c is applied, is mounted on the bonding jig 40 illustrated in FIG. 9 (Step 122). Subsequently, the circuit board 30 and the terminal boards 34 and 35 are mounted on the base plate 20 so as to be bonded to each other under pressure, thereby fabricating the semi-finished assembly (Step 123; see FIGS. 7 and 8).

After that, the adhesive 28c is cured by heating and drying (Step 124). Then, the external connection terminals 34a, 34b, 35a, and 35b and the terminal connection electrodes 36 provided on the second board surface 30b are connected by the bonding wires 37 which are thin aluminum wires (Step 125; see FIG. 10) to fabricate the assembly in which the base plate 20, the circuit board 30, and the terminal boards 34 and 35 are integrated.

In the resin-molding process 130 subsequent to the assembly and connection process 120, the assembly is first placed between the molding dies 51 and 52 which are pre-heated (Step 131). After that, the molding resin 11, which is a heated and melted thermally-curable resin, is injected under pressure into the space between the upper molding die 51 and the lower molding die 52. With the completion of the injection, the movable pins 54 and 55 are removed (Step 132; see FIGS. 11 to 13C).

Subsequently, the assembly is demolded from the molding dies 51 and 52 and is re-heated for several tens of minutes to stabilize the molding material (Step 133).

The position of the assembly in the space between the dies 51 and 52 is determined so that the injected molding resin 11 has a vertically uniform thickness.

Specifically, a total thickness Tx of the assembly is equal to the sum of the thickness dimension T0 of the circuit board 30, the height dimension T2 of the second circuit components 32, and the dimension (T1, Tb)max corresponding to larger one of the height dimension T1 of the first circuit components 31 and the thickness dimension Tb of the base plate 20. A half thickness of Tx is as expressed by Formula (4).

$$Tx/2 = \{T0 + (T1, Tb)\max + T2\}/2 \qquad (4)$$

On the other hand, $T0 + T2 \leq (T1, Tb)\max$ is obtained by Formula (1) described above and hence is assigned to Formula (4) to obtain Formula (5).

$$(T1, Tb)\max \geq Tx/2T0 - T2 \qquad (5)$$

Therefore, a boundary plane obtained by dividing a total thickness T10 of the molding resin 11 into equal thicknesses T11 and T12 in a thickness direction, that is, T11=T10/2 and T12=T10/2, is positioned closer to the surface of the base plate 20, which is opposite to the surface of the base plate 20 on which the circuit board 30 is bonded. As a result, the filling of the molding resin 11 does not become uneven in the thickness direction as viewed from the circuit board 30.

In the terminal-board cutting process 140 subsequent to the resin-molding process 130, the assembly, for which molding is completed, is mounted on a cutting jig for cutting the terminal boards 34 and 35 (Step 141). The connection plates 34e and 35e, and the temporary fixing pieces 34c, 34d, 35c, and 35d are cut and removed (Step 142), thereby completing the electronic controller 10 illustrated in FIG. 1 (Step 150).

The method of fabricating the electronic controller 10 through the processes described above includes the circuit-component mounting process 110*b*, the assembly and connection process 120, the resin-molding process 130, and the terminal-board cutting process 140. In the circuit-component mounting process 110*b*, the first circuit components 31 and the second circuit components 32 are mounted on the circuit board 30. In the assembly and connection process 120, the temporary fixing pieces 34*c* and 34*d* of the terminal board 34 obtained by integrating the external connection terminals 34*a* and 34*b* and the temporary fixing pieces 34*c* and 34*d* through an intermediation of the connection plate 34*e* or 34*f* are temporarily fixed to the first exposed portion 21*a* and the second exposed portion 21*b* of the base plate 20, whereas the temporary fixing pieces 35*c* and 35*d* of the terminal board 35 obtained by integrating the external connection terminals 35*a* and 35*b* and the temporary fixing pieces 35*c* and 35*d* through an intermediation of the connection plate 35*e* or 35*f* are temporarily fixed to the first exposed portion 21*a* and the second exposed portion 21*b* of the base plate 20. At the same time, the thermally-curable or moisture-curable adhesive 28*c* is applied onto the surface of a part of the base plate 20 to bond and fix the circuit board 30 on which the first circuit components 31 and the second circuit components 32 are mounted in the circuit-component mounting process 110*b*. Then, the external connection terminals 34*a*, 34*b*, 35*a*, and 35*b* and the terminal connection electrodes 36 are electrically connected to form the assembly. In the resin-molding process 130, the thus obtained assembly is placed between the molding dies 51 and 52 and pre-heated. Then, the heated and melted thermally-curable molding resin 11 is injected under pressure into the space between the molding dies 51 and 52. After the demolding, heating is maintained for a while. In the terminal-board cutting process 140, the terminal boards 34 and 35 are cut so that the temporary fixing pieces 34*c*, 34*d*, 35*c*, and 35*d* and the connection plates 34*e* or 34*f* and 35*e* or 35*f* are cut off. The boundary plane obtained by dividing the total thickness T10 of the molding resin 11 into the equal thicknesses T11 and T12 in the thickness direction, that is, T11=T10/2 and T12=T10/2, is positioned in the direction closer to the surface of the base plate 20, which is opposite to the surface of the base plate 20 on which the circuit board 30 is bonded.

Therefore, a central position of the total thickness of the molding resin 11 is close to an intermediate position of the sum of the height dimension of the first circuit components 31, the thickness dimension of the circuit board 30, and the height dimension of the second circuit components 32. Therefore, the integral molding is performed without unevenly forming the thicknesses as the outer covering material portions as viewed from the circuit board 30. Therefore, the amount of the molding resin 11 is saved.

Further, in the terminal boards 34 and 35, the temporary fixing pieces 34*c*, 34*d*, 35*c*, and 35*d* are provided in the both end portions of the connection plates 34*e*, 34*f*, 35*e*, and 35*f*. Further, each of the temporary fixing pieces 34*c*, 34*d*, 35*c*, and 35*d* has the same shape as that of each of the external connection terminals 34*a*, 34*b*, 35*a*, and 35*b*. The external connection terminals 34*a*, 34*b*, 35*a*, and 35*b* are connected to the terminal connection electrodes 36 in a state in which the temporary fixing pieces 34*c*, 34*d*, 35*c*, and 35*d* are temporarily fixed to the cutoff areas 21 *as* and 21*bb* respectively provided in both end portions of the first exposed portion 21*a* and the second exposed portion 21*b*.

Therefore, by cutting the elongated terminal boards, with which the large number of external connection terminals are integrated, so as to remove some of the external connection terminals, the plurality of external connection terminals 34*a*, 34*b*, 35*a*, and 35*b* arranged at desired positions can be easily obtained.

Moreover, the external connection terminals 34*a*, 34*b*, 35*a*, and 35*b* are temporarily fixed, and hence can be electrically connected to the terminal connection electrodes 36 with ease.

In the circuit-component mounting process 110*b*, the first circuit components 31 are the surface-mounted components bonded onto the first board surface 30*a* of the circuit board 30 by the solder connection or the electrically conductive paste. The second circuit components 32 are fixed onto the second board surface 30*b* of the circuit board 30 by the adhesive bonding or the solder connection after the completion of the solder connection or the adhesive bonding of the first circuit components 31. The electrodes of the second circuit components 32 are connected to the component connection electrodes (not shown) provided on the second board surface 30*b* of the circuit board 30 by the bonding wires (not shown).

As described above, the second circuit components 32 are connected to the circuit board 30 by the bonding wires after the connection or the bonding of the first circuit components 31. Therefore, the bare chip components can be prevented from being contaminated in the soldering step or the bonding step. In addition, an accident that the bonding wires oscillate to come into contact with each other can be prevented from occurring.

Further, in the circuit-board fabrication process 110*a* which is performed prior to the circuit-component mounting process 110*b*, the printed resistors obtained by printing and baking the resistor material are generated as the third circuit components 33.

As described above, the printed resistors obtained by printing and baking are formed on the second board surface 30*b* in the fabrication process of the circuit board 30. Thus, the printed resistors are generated during the process of generation of the circuit pattern in the board fabrication process. A connection operation is thus not required in the circuit-component mounting process. As a result, a soldering process for the second board surface 30*b* can be omitted.

Further, in the resin-molding process 130, the movable pins 54 and 55 are slidably inserted through the upper molding die 51 and the lower molding die 52. The movable pins 54 and 55 press and interpose the portions 27A or 27B to be pressed under pressure, which are provided in the window frame portion constituting the central window hole 22*a* of the base plate 20. At the time of completion of the injection of the molding resin 11 under pressure, the movable pins 54 and 55 are removed. Therefore, in the resin-molding process 130 for injecting the molding resin 11 under pressure, the base plate 20 is pressed and sandwiched between the molding pins 54 and 55 respectively provided to the upper molding die 51 and the lower molding die 52. At the time of completion of the injection of the molding resin 11 under pressure, the movable pins 54 and 55 are removed.

Thus, the base plate 20 can be prevented from being curved and deformed by the pressure of the molding resin 11 to be injected under pressure. At the same time, the spaces formed by removing the movable pins 54 and 55 can be filled with the molding resin 11 in the melted state to prevent the generation of concave portions in the outer covering material portions.

Further, in the resin-molding process 130, the injection port 53 for the molding resin 11, which is provided to one of the upper molding die 51 and the lower molding die 52, has the distal end portion which faces the connection slit 23 formed between the first exposed portion 21*a* and the central window hole 22*a*.

Therefore, the injection port 23 of the molding resin 11 can be provided without being disturbed by the external connection terminals 34*a*, 34*b*, 35*a*, and 35*b* and the exposed portions of the base plate 20.

In the terminal-board cutting process 140, the connection plate 34f of the terminal board 34 constitutes a part of the external connection terminals 34a and 34b, whereas the connection plate 35f of the terminal board 35 constitutes a part of the external connection terminals 35a and 35b. The connection plates 34f and 35f are cut for each of the external connection terminals 34a, 34b, 35a, and 35b along the direction in which the external connection terminals extend (see FIG. 21).

Figure 20:
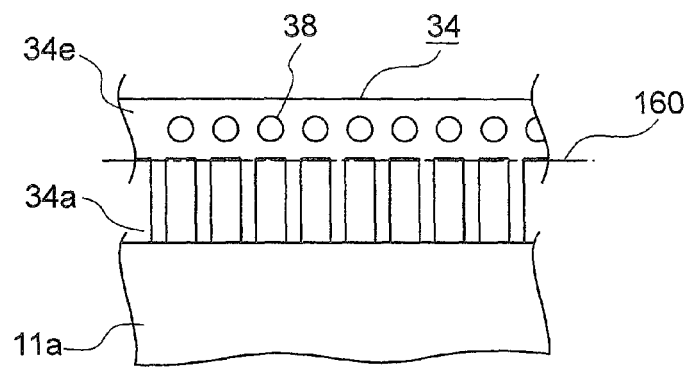
FIG. 20 is an enlarged view of a principal part of FIG. 14.
Figure 21:
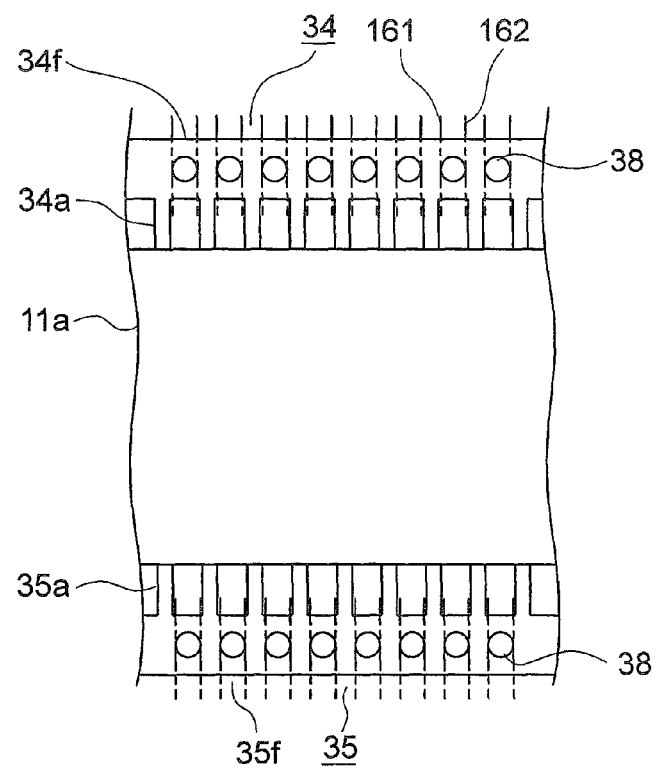
FIG. 21 is an enlarged view of a principal part illustrating modification of a terminal board.

Therefore, by cutting the connection plates 34f and 35f for each of the external connection terminals, the amount of wasted material is reduced as compared with that illustrated in FIG. 20. In addition, in a state in which the connection plates 34f and 35f are still connected to the terminal boards 34 and 35, the length of a rear end portion of each of the external connection terminals is reduced. As a result, the curvature and deformation hardly occur.

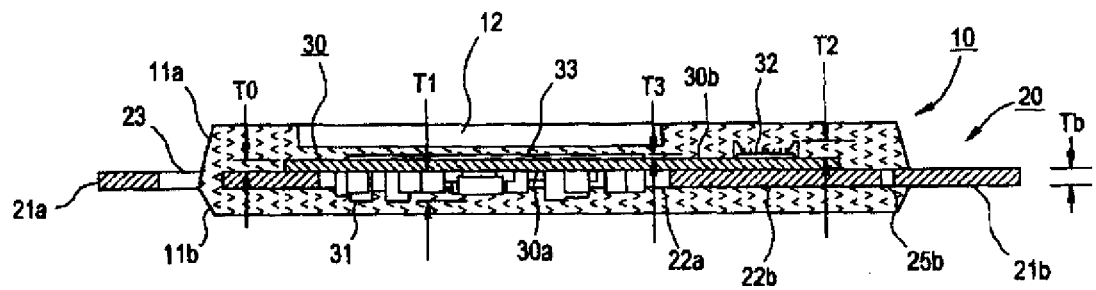

The invention claimed is:

1. A resin-sealed electronic controller, comprising:
   a circuit board on which a plurality of circuit components are mounted;
   a thermally-conductive base plate bonded to the circuit board;
   a plurality of external connection terminals connected to the circuit board; and
   a molding resin for covering the entire circuit board and a part of the external connection terminals and the base plate to form outer covering material portions, the resin-sealed electronic controller being formed by integral molding with the molding resin, wherein:
   the base plate includes a central window hole formed in a middle portion, a first exposed portion and a second exposed portion exposed to exterior and fixed to mounting portions, and an adjacent flat portion adjacent to the central window hole formed in the middle portion adjacent to the central window hole, which is covered with the molding resin;
   the circuit board includes a first board surface on which the first circuit components are mounted so as to be located in the central window hole, and a second board surface corresponding to a rear surface of the first board surface, on which the second circuit components are mounted in an area opposed to the adjacent flat portion;
   the external connection terminals are connected to terminal connection electrodes provided on the second board surface; and
   the second circuit components are heat-generating components having a smaller height than a height of the first circuit components.

2. A resin-sealed electronic controller according to claim 1, wherein:
   T0 is a thickness dimension of the circuit board, T2 is a height dimension of the second circuit components, Tb is a thickness dimension of the base plate and T1 is a height dimension of the first circuit components, and sum of (T0+T2)≤bigger one of (Tb or T1);
   the first circuit components are surface-mounted components electrically connected to the circuit board in the first board surface;
   the second circuit components are thin heat-generating components having a bare-chip structure, which are electrically connected to the circuit board in the second board surface; and
   the second board surface has mounted thereon third circuit components having a smaller height than the height of the second circuit components.

3. A resin-sealed electronic controller according to claim 2, wherein the circuit board is formed of a ceramic board, and the third circuit components comprise thin planar resistive elements.

4. A resin-sealed electronic controller according to claim 1, wherein:
   the plurality of external connection terminals are arranged in parallel to a direction in which the central window hole and the adjacent flat portion are arranged;
   the external connection terminals are arranged separately into a first row constituted of the external connection terminals and a second row constituted of the external connection terminals, the first row being further separated into a first group constituted of the external connection terminals and a second group constituted of the external connection terminals, the second row being further separated into a first group constituted of the external connection terminals and a second group constituted of the external connection terminals;
   the base plate includes portions to be pressed, which are provided to parallel window frame portions corresponding to peripheral edge portions of the central window hole, the parallel window frame portions being parallel to the external connection terminals between the first groups and the second groups; and
   the portions to be pressed are pressed and sandwiched between molding dies when the molding resin is injected into a space between the molding dies to form the outer covering material portions by molding.

5. A resin-sealed electronic controller according to claim 1, wherein:
   the base plate includes a connection slit formed between the first exposed portion and the central window hole, and a plurality of small connection holes formed between the second exposed portion and the adjacent flat portion; and
   one external covering material portion and another external covering material portion are connected to each other through the connection slit and the small connection holes, while interposing the base plate therebetween.

6. A method of fabricating the resin-sealed electronic controller according to claim 1, comprising:
   a circuit-component mounting process of mounting the first circuit components and the second circuit components on the circuit board;
   an assembly and connection process of temporary fixing pieces of terminal boards obtained by integrating the external connection terminals and the temporary fixing pieces through an intermediation of connection plates to the first exposed portion and the second exposed portion of the base plate, applying a thermally-curable or moisture-curable adhesive onto a surface of a part of the base plate to bond and fix the circuit board on which the first circuit components and the second circuit components are mounted in the circuit-component mounting process, and electrically connecting the external connection terminals and the terminal connection electrodes to each other to form an assembly;
   a resin-molding process of placing the assembly between the molding dies, injecting the heated and melted thermally-curable molding resin under pressure after preheating, and maintaining heating for a while after demolding; and
   a terminal-board cutting process of cutting the terminal boards to separate the temporary fixing pieces and the connection plates, wherein a boundary plane obtained by dividing a total thickness (T10) of the molding resin (11) into T11=T10/2 and T12=T10/2, which are equal to each other in a thickness direction, is set to be located closer to a surface of the base plate, which is opposite to a surface of the base plate on which the circuit board is bonded.

7. method of fabricating a resin-sealed electronic controller according to claim 6, wherein:

the temporary fixing pieces of the terminal board are provided in both end portions of the connection plate, whereas the temporary fixing pieces of the terminal board are provided in both end portions of the connection plate, and each of the temporary fixing pieces has the same shape as a shape of each of the external connection terminals; and the external connection terminals are connected to the terminal connection electrodes in a state in which the temporary fixing pieces are temporarily fixed to cutoff areas provided to respective both end portions of the first exposed portion and the second exposed portion.

8. A method of fabricating a resin-sealed electronic controller according to claim 6, wherein the circuit-component mounting process further includes:

bonding the first circuit components onto the first board surface of the circuit board by solder connection or an electrically conductive paste as surface-mounted components;

fixing the second circuit components onto the second board surface of the circuit board by adhesive bonding or soldering connection after completion of the soldering connection or adhesive bonding of the first circuit components; and connecting electrodes of the second circuit components to components connection electrodes of the circuit board by bonding wires.

9. A method of fabricating a resin-sealed electronic controller according to claim 6, further comprising a circuit-board fabrication process, corresponding to a pre-process of the circuit-component mounting process, of generating printed resistors obtained by printing and baking a resistor material as the third circuit components.

10. A method of fabricating a resin-sealed electronic controller according to claim 6, wherein the resin-molding process further includes slidably inserting movable pins into the upper molding die and the lower molding die, the movable pins sandwiching the portions to be pressed provided in the window frame portion constituting the central window hole of the base plate so as to come into pressure contact therewith, and removing the movable pins at time of completion of the injection of the molding resin under pressure.

11. A method of fabricating a resin-sealed electronic controller according to claim 6, wherein the resin-molding process further includes forming an injection port for the molding resin, which is provided to one of the upper molding die and the lower molding die, and has a distal end portion exposed to the connection slit formed between the first exposed portion and the central window hole.

12. A method of fabricating a resin-sealed electronic controller according to claim 6, wherein the terminal-board cutting process further includes cutting the connection plate of the terminal board and the connection plate of the terminal board, which constitute a part of the external connection terminals, for each of the external connection terminals along a direction in which the external connection terminals extend.

* * * * *

UNITED STATES PATENT AND TRADEMARK OFFICE
CERTIFICATE OF CORRECTION

| | | Page 1 of 2 |
|---|---|---|
| PATENT NO. | : 8,717,766 B2 | |
| APPLICATION NO. | : 13/326531 | |
| DATED | : May 6, 2014 | |
| INVENTOR(S) | : Fumiaki Arimai et al. | |

It is certified that error appears in the above-identified patent and that said Letters Patent is hereby corrected as shown below:

Delete the title page and substitute the attached title page therefor.

In the Claims

Remove claims 6-12 at column 18, line 42 through column 20, line 32 of the patent.

Signed and Sealed this
Sixteenth Day of December, 2014

Michelle K. Lee
*Deputy Director of the United States Patent and Trademark Office*

(12) United States Patent
Arimai et al.

(10) Patent No.: US 8,717,766 B2
(45) Date of Patent: May 6, 2014

(54) RESIN-SEALED ELECTRONIC CONTROLLER AND METHOD OF FABRICATING THE SAME

(75) Inventors: Fumiaki Arimai, Chiyoda-ku (JP); Hiroyoshi Nishizaki, Chiyoda-ku (JP); Shozo Kanzaki, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 44 days.

(21) Appl. No.: 13/326,531

(22) Filed: Dec. 15, 2011

(65) Prior Publication Data
US 2012/0300404 A1   Nov. 29, 2012

(30) Foreign Application Priority Data
May 26, 2011   (JP) .................................. 2011-117779

(51) Int. Cl.
*H05K 7/20*   (2006.01)

(52) U.S. Cl.
USPC .......... 361/720; 361/719; 257/706; 257/707

(58) Field of Classification Search
None
See application file for complete search history.

(56) References Cited

U.S. PATENT DOCUMENTS

| | | | | |
|---|---|---|---|---|
| 6,429,513 B1* | 8/2002 | Shermer et al. | | 257/714 |
| 6,770,970 B2* | 8/2004 | Kobayashi | | 257/728 |
| 6,943,457 B2* | 9/2005 | Smith | | 257/790 |
| 7,439,452 B2* | 10/2008 | Masuda | | 174/536 |
| 7,453,138 B2 | 11/2008 | Kawakami et al. | | |
| 7,514,784 B2* | 4/2009 | Mayuzumi et al. | | 257/712 |
| 7,846,779 B2* | 12/2010 | Yang | | 438/123 |
| 7,868,430 B2* | 1/2011 | Paulus et al. | | 257/668 |
| 7,888,852 B1* | 2/2011 | Sung | | 313/46 |
| 7,906,859 B2* | 3/2011 | Yoshioka et al. | | 257/788 |
| 8,169,782 B2* | 5/2012 | Takahashi et al. | | 361/721 |
| 8,207,607 B2* | 6/2012 | Yamagishi et al. | | 257/724 |
| 8,472,197 B2* | 6/2013 | Higashibata et al. | | 361/722 |
| 2008/0123299 A1* | 5/2008 | Takakusaki et al. | | 361/719 |

FOREIGN PATENT DOCUMENTS

| | | |
|---|---|---|
| JP | 05-73957 U | 10/1993 |
| JP | 06-163811 A | 6/1994 |
| JP | 07-74195 A | 3/1995 |
| JP | 11-150216 A | 6/1999 |
| JP | 2003-37241 A | 2/2003 |
| JP | 2004-119465 A | 4/2004 |
| JP | 4283514 A | 6/2009 |
| JP | 2011-3680 A | 1/2011 |

OTHER PUBLICATIONS

Preliminary Notice of Reasons for Rejection dated Aug. 20, 2013, issued in Japanese Patent Application No. 2011-117779.

* cited by examiner

*Primary Examiner* — Boris Chervinsky
(74) *Attorney, Agent, or Firm* — Sughrue Mion, PLLC

(57) ABSTRACT

A resin-sealed electronic controller obtained by bonding and fixing a circuit board to a thermally-conductive base plate, and integrating circuit components with a molding resin so as to reduce the size. A base plate includes a first exposed portion, a second exposed portion, and an adjacent flat portion adjacent to a central window hole. First circuit components which are low-heat-generating components with large height are located in the central window hole. Second circuit components which are high-heat-generating components with small height are provided on an area corresponding to the adjacent flat portion. A height dimension of the first circuit components at least partially overlaps a thickness dimension of the base plate, to reduce a total thickness dimension. The high-heat-generating components and the low-heat-generating components being provided separately from each other permits increased mounting density of low-heat-generating components, reducing an area of the circuit board.

5 Claims, 15 Drawing Sheets